United States Patent
Schloss

(10) Patent No.: US 8,208,284 B2
(45) Date of Patent: *Jun. 26, 2012

(54) DATA RETENTION STRUCTURE FOR NON-VOLATILE MEMORY

(75) Inventor: Lawrence Schloss, Palo Alto, CA (US)

(73) Assignee: Unity Semiconductor Corporation

( * ) Notice: Subject to any disclaimer, the term of this patent is extended or adjusted under 35 U.S.C. 154(b) by 639 days.

This patent is subject to a terminal disclaimer.

(21) Appl. No.: 12/075,017

(22) Filed: Mar. 7, 2008

(65) Prior Publication Data

US 2009/0225582 A1 Sep. 10, 2009

(51) Int. Cl.
*G11C 11/00* (2006.01)

(52) U.S. Cl. ........ 365/148; 365/151; 365/158; 365/171; 365/173

(58) Field of Classification Search .................. 365/148, 365/151, 158, 171, 173
See application file for complete search history.

(56) References Cited

U.S. PATENT DOCUMENTS

| | | | |
|---|---|---|---|
| 4,784,910 A | 11/1988 | Nagai et al. |
| 6,034,882 A | 3/2000 | Johnson et al. |
| 6,518,156 B1 | 2/2003 | Chen et al. |
| 6,534,784 B2 | 3/2003 | Eliasson et al. |
| 6,563,185 B2 | 5/2003 | Moddel et al. |
| 6,756,649 B2 | 6/2004 | Moddel et al. |
| 6,762,071 B2 | 7/2004 | Eliasson et al. |
| 6,856,536 B2 | 2/2005 | Rinerson et al. |
| 6,972,238 B2 | 12/2005 | Hsu et al. |
| 7,009,235 B2 | 3/2006 | Rinerson et al. |
| 7,060,586 B2 | 6/2006 | Li et al. |
| 7,102,156 B1 | 9/2006 | Kingsborough et al. |
| 7,105,852 B2 | 9/2006 | Moddel et al. |
| 7,148,144 B1 | 12/2006 | Avanzino |
| 7,148,533 B2 | 12/2006 | Hsu et al. |
| 7,154,769 B2 * | 12/2006 | Krieger et al. ................ 365/148 |
| 7,173,275 B2 | 2/2007 | Estes et al. |
| 7,186,569 B2 | 3/2007 | Rinerson et al. |
| 7,218,984 B1 | 5/2007 | Bayat et al. |
| 7,220,985 B2 | 5/2007 | Cheung et al. |
| 7,256,429 B2 | 8/2007 | Hsu et al. |
| 7,388,276 B2 | 6/2008 | Estes et al. |
| 7,408,212 B1 | 8/2008 | Luan et al. |
| 7,417,271 B2 | 8/2008 | Genrikh et al. |
| 7,446,010 B2 | 11/2008 | Li et al. |
| 7,459,716 B2 | 12/2008 | Toda et al. |
| 7,460,385 B2 | 12/2008 | Gruber et al. |

(Continued)

OTHER PUBLICATIONS

U.S. Appl. No. 12/283,339, filed Sep. 11, 2008, Rinerson et al.

(Continued)

*Primary Examiner* — Pho M Luu
*Assistant Examiner* — Thao Bui

(57) ABSTRACT

A data retention structure in a memory element that stores data as a plurality of conductivity profiles is disclosed. The memory element can be used in a variety of electrical systems and includes a conductive oxide layer, an ion impeding layer, and an electrolytic tunnel barrier layer. A write voltage applied across the memory element causes a portion of the mobile ions to move from the conductive oxide layer, through the ion impeding layer, and into the electrolytic tunnel barrier layer thereby changing a conductivity of the memory element, or the write voltage causes a quantity of the mobile ions to move from the electrolytic tunnel barrier layer, through the ion impeding layer, and back into the conductive oxide layer. The ion impeding layer is operative to substantially stop mobile ion movement when a voltage that is less than the write voltage is applied across the memory element.

14 Claims, 13 Drawing Sheets

U.S. PATENT DOCUMENTS

| | | |
|---|---|---|
| 7,462,857 B2 | 12/2008 | Arai et al. |
| 7,558,099 B2 | 7/2009 | Morimoto |
| 7,569,459 B2 | 8/2009 | Karg et al. |
| 7,577,022 B2 | 8/2009 | Muraoka et al. |
| 7,606,086 B2 | 10/2009 | Inoue |
| 7,633,108 B2 | 12/2009 | Li et al. |
| 2002/0072245 A1* | 6/2002 | Ooms et al. .................. 438/758 |
| 2002/0163831 A1* | 11/2002 | Krieger et al. ................ 365/151 |
| 2003/0151959 A1 | 8/2003 | Tringali et al. |
| 2004/0100817 A1 | 5/2004 | Subramanian et al. |
| 2005/0083760 A1 | 4/2005 | Subramanian et al. |
| 2005/0157535 A1* | 7/2005 | Jackson et al. ............... 365/151 |
| 2006/0067105 A1* | 3/2006 | Fang et al. .................... 365/148 |
| 2006/0171200 A1* | 8/2006 | Rinerson et al. ........... 365/185.1 |
| 2006/0273301 A1 | 12/2006 | Moddel et al. |
| 2007/0001167 A1* | 1/2007 | Nomura ......................... 257/40 |
| 2007/0105390 A1 | 5/2007 | Oh |
| 2007/0120110 A1 | 5/2007 | Estes et al. |
| 2007/0158716 A1 | 7/2007 | Rinerson et al. |
| 2008/0173975 A1 | 7/2008 | Chen et al. |
| 2008/0272363 A1 | 11/2008 | Mouli |
| 2008/0273363 A1 | 11/2008 | Mouli |
| 2008/0280125 A1 | 11/2008 | Denton et al. |
| 2009/0026434 A1 | 1/2009 | Malhotra et al. |

OTHER PUBLICATIONS

U.S. Appl. No. 11/881,474, filed Jul. 26, 2007, Cheung et al.
U.S. Appl. No. 11/881,496, filed Jul. 26, 2007, Cheung et al.
U.S. Appl. No. 11/881,473, filed Jul. 26, 2007, Brewer et al.
Tabib-Azar, Mossood, "CuS and AgS Solid-Electrochemical Cells as Non-Volatile Memory Devices", 2004 Joint Meeting of the Electrochemical Society, Inc, Honolulu, Oct. 8, 2004.
Inoue, M. B., "Characterization of New Copper Sulfide Materials", Superficies y Vacio 9, pp. 219-221, Dec. 1999.
Popovivi, I., "Electrical Conductivity in Copper Sulfides—Influence of the Deposition Parameters and Precursor's Concentration", Bullentin of the Transilvania University of Brasov, vol. 2 (51)—2009 Series 1.
Kozicki, M. N., "Nonvolatile Memory Based on Solid Electrolytes", Non-Voltaile Memory Technology Symposium, 2004, pp. 10-17, Nov. 15-17, 2004.
Nishi, Yoshio, "Recent Progress in Resistance Change Memory", AVS Thin Films Users Group Meeting, Oct. 15, 2008.

\* cited by examiner

| Wafer | Description | Erase Slope | Program Slope |
|---|---|---|---|
| X187-1 | Pt \ PCMO \ YSZ (25Å) \ Pt | -15.6 | 9.3 |
| X212-1 | Pt \ PCMO \ YSZ (30Å) \ Pt | -17.3 | 4.3 |
| | | | |
| X205-11 | Pt \ PCMO \ $SiO_x$ (4Å) \ YSZ (20Å) \ Pt | -9.2 | 1.1 |
| X205-12 | Pt \ PCMO \ $SiO_x$ (8Å) \ YSZ (20Å) \ Pt | -5.7 | 1.7 |
| X229-4 | Pt \ PCMO \ $SiO_x$ (20Å) \ YSZ (20Å) \ Pt | -8.0 | 0.2 |

DATA RETENTION STRUCTURE FOR NON-VOLATILE MEMORY

FIELD OF THE INVENTION

The present invention relates generally to non-volatile memory. More specifically, the present invention relates to thin-film structures in non-volatile memory.

BACKGROUND OF THE INVENTION

Data storage in high-density memory devices can be accomplished using a variety of techniques. Often, the technique used depends on whether or not the stored data is volatile or non-volatile. In volatile memory devices, such as SRAM and DRAM, for example, stored data is not retained when power is removed from the memory device. On the other hand, for non-volatile memory devices, such as MRAM and Flash devices, stored data is retained when power is removed from the memory device.

Resistive state memory devices are a promising new type of non-volatile memory in which data is stored in a memory element as a plurality of conductivity profiles (e.g., distinct resistive states). A first conductivity profile can represent a logic "1" and a second conductivity profile can represent a logic "0". The first and second conductivity profiles can be set by applying a write voltage of a predetermined magnitude, polarity, and duration across the memory element during a write operation. For example, voltage pulses can be used to write a logic "1" and a logic "0", respectively.

In either case, after data has been written to the memory element, reading the value of the stored data in the memory element is typically accomplished by applying a read voltage across the memory element and sensing a read current that flows through the memory element. For example, if a logic "0" represents a high resistance and a logic "1" represents a low resistance, then for a constant read voltage, a magnitude of the read current can be indicative of the resistive state of the memory element. Therefore, based on Ohm's law, the read current will be low if the data stored is a logic "0" (e.g., high resistance) or the read current will be high if the data stored is a logic "1" (e.g., low resistance). Consequently, the value of the stored data can be determined by sensing the magnitude of the read current.

In high density memory devices, it is desirable to pack as many memory cells as possible in the smallest area possible in order to increase memory density and data storage capacity. One factor that can have a significant impact on memory density is the number of terminals that are required to access a memory element for reading or writing. As the number of terminals required to access the memory element increases, device area increases with a concomitant decrease in areal density. Most memory technologies, such as DRAM, SRAM, and some MRAM devices, require at least three terminals to access the core memory element that stores the data. However, in some memory technologies, such as certain resistance based memories, two terminals can be used to both read and write data to/from the memory element.

An array of two terminal memory elements can include a plurality of row conductors and a plurality of column conductors and each memory element can have a terminal connected with one of row conductors and the other terminal connected with one of the column conductors. The typical arrangement is a two terminal cross-point memory array where each memory element is positioned approximately at an intersection of one of the row conductors with one of the column conductors. The terminals of the memory element connect with the row and column conductors above and below it. A single memory element can be written by applying the write voltage across the row and column conductors the memory element is connected with. Similarly, the memory element can be read by applying the read voltage across the row and column conductors the memory element is connected with. The read current can be sensed (e.g., measured) flowing through the row conductor or the column conductor.

One challenge for some non-volatile memories is data retention, that is, the ability of stored data to be retained in the absence of power. Ideally, stored data is retained indefinitely in the absence of power. Examples of factors affecting data retention include but are not limited to memory element structure, material used in the memory element, and voltages applied across the memory elements during data operations, such as read and write operations. When a read or write voltage is applied across the two terminals of a selected memory element, approximately half of the voltage potential is supplied by the row conductor and half by the column conductor. Accordingly, other memory elements having a terminal connected with the row conductor or column conductor also have a voltage potential applied across their respective terminals. Those un-selected memory elements are generally referred to as half-selected memory elements because one of their terminals has ½ of a read voltage potential or ½ of a write voltage potential applied to it and the other terminal is typically at a ground potential. The potential difference across the terminals is referred to as a half-select voltage. The half-select voltage can generate electric fields, that over time, can disturb (e.g., corrupt) the stored data in those memory elements. Moreover, because write voltages are typically greater in magnitude than read voltages, the half-select voltages during write operations are greater than the half-select voltages during read operations. Therefore, it is desirable for the write voltages to affect stored data only in the selected memory element(s) and not in half-selected memory elements.

Although the magnitude of half-select voltages may be lower for read operations, in some applications, a majority of data operations to a non-volatile memory may comprise read operations. Repeated read operations may result in numerous applications of read voltages and half-select voltages to memory elements in a memory device. The application of half-select voltages during read operation may affect data retention in half-selected memory elements. However, those skilled in the art will appreciate that some design choices will affect the extent an array is exposed to half-select voltages. For example, a page mode read might not cause the array to experience any half-select voltages during read operations.

There are continuing efforts to improve non-volatile memory.

Figure 1:
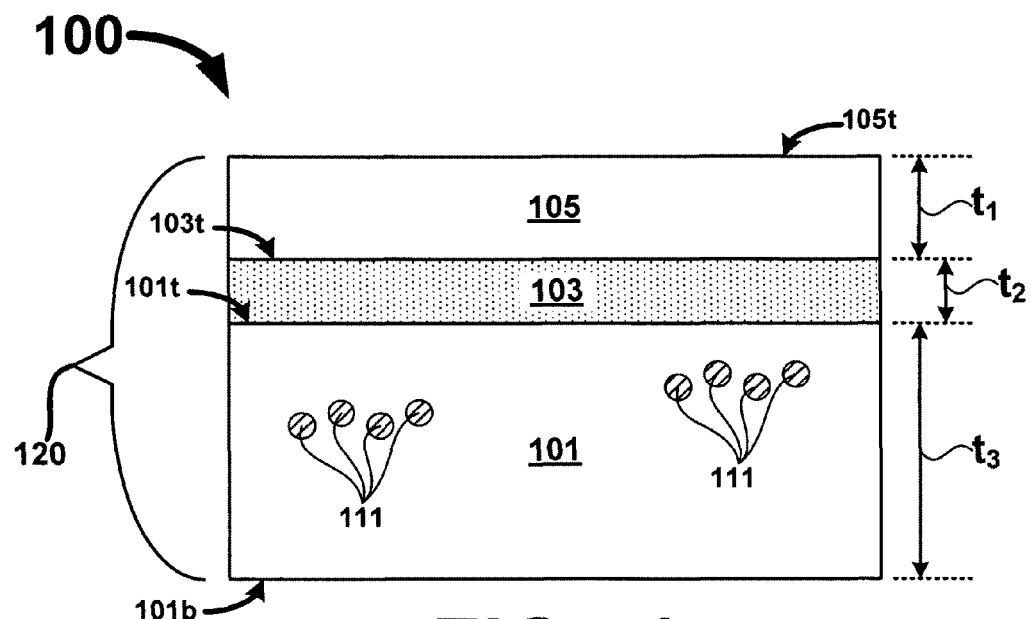
FIG. 1 depicts a memory element including mobile ions and storing data as a first conductivity profile.

Although the previous drawings depict various examples of the invention, the invention is not limited by the depicted examples. Furthermore, the depictions are not necessarily to scale.

DETAILED DESCRIPTION

In the following detailed description and in the several figures of the drawings, like elements are identified with like reference numerals.

As shown in the drawings for purpose of illustration, the present invention is embodied in a non-volatile memory device, a non-volatile memory element, and a non-volatile memory array.

Figure 3A:
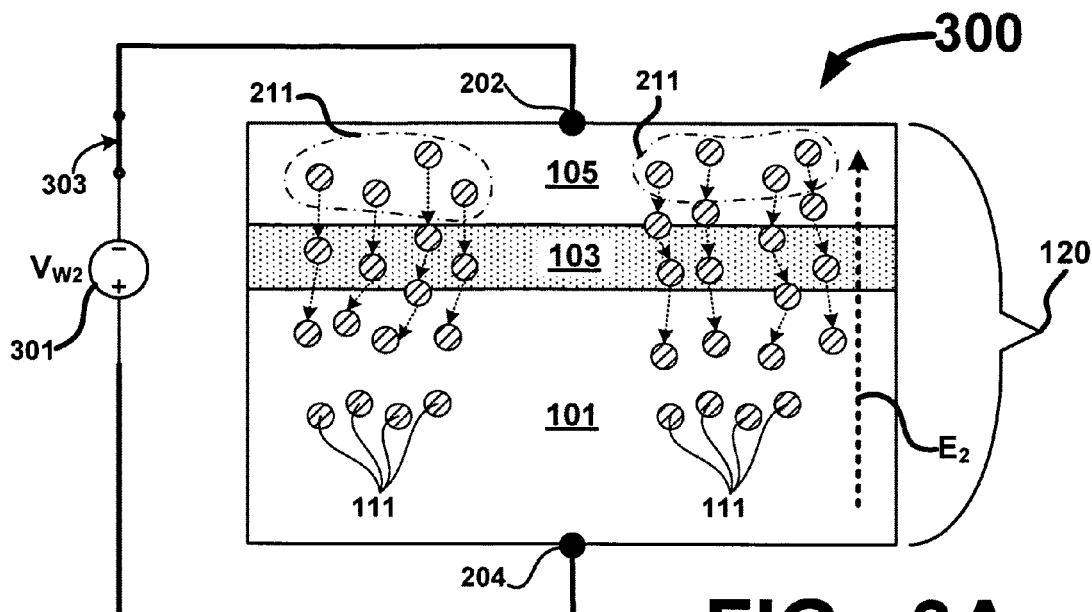
FIG. 3A depicts a memory element switching from the second conductivity profile to the first conductivity profile.
Figure 3B:
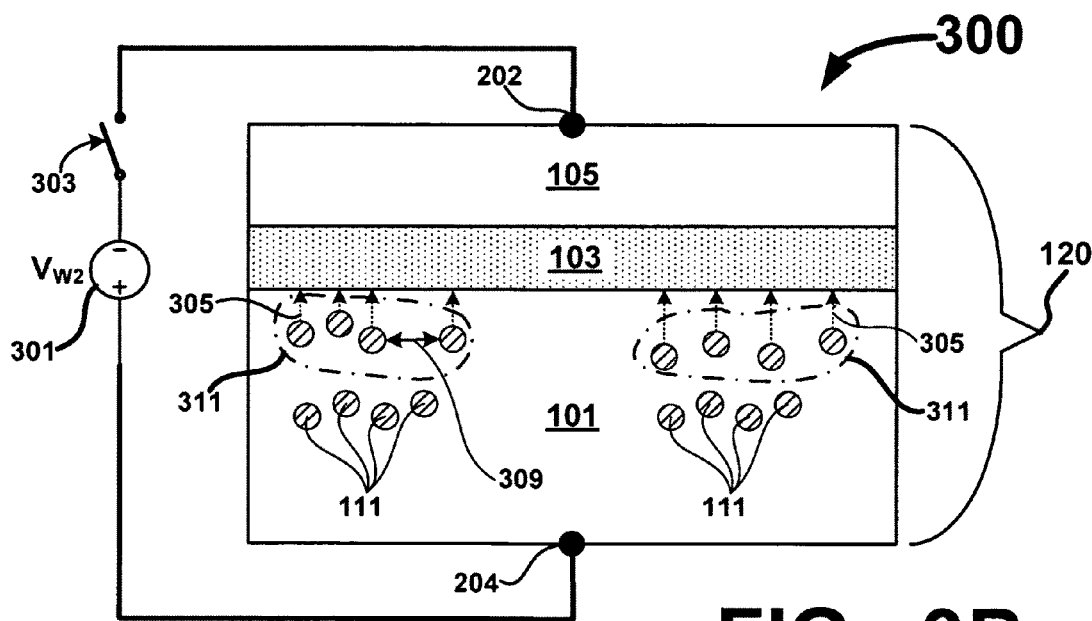
FIG. 3B depicts a memory element having the first conductivity profile.
Figure 3C:
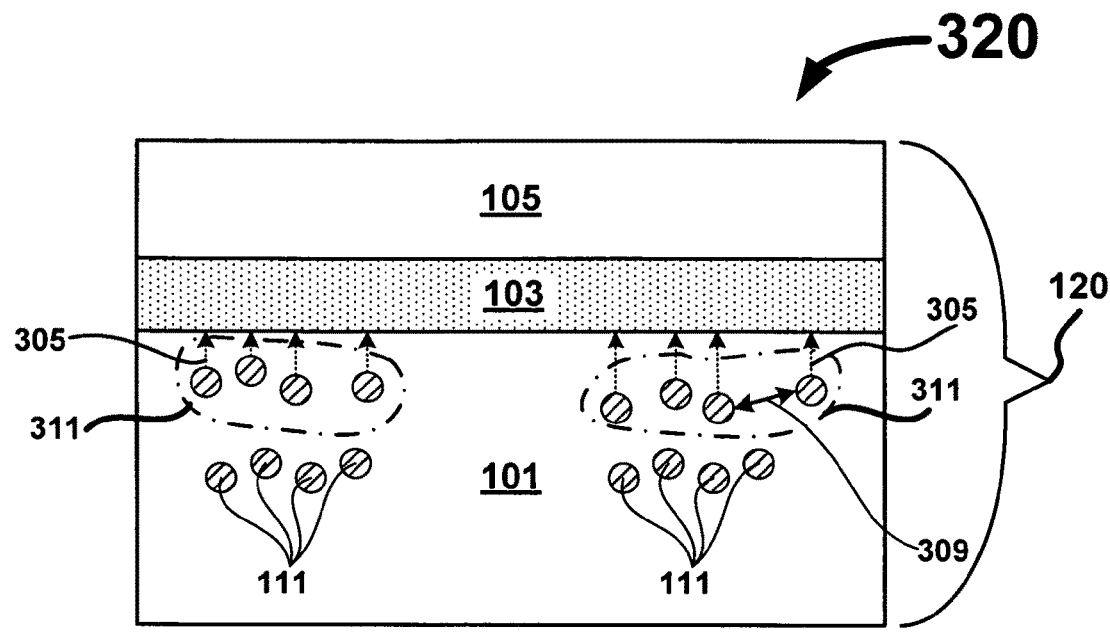
FIG. 3C depicts retention of the first conductivity profile.
Figure 3D:
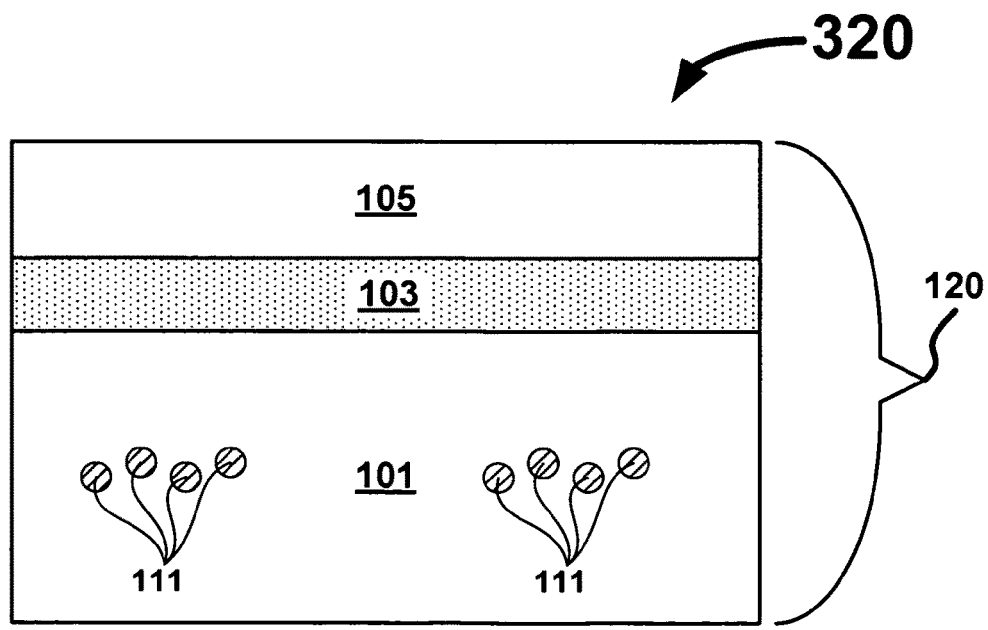

Reference is now made to FIG. 1 and similarly as in FIG. 3D where a non-volatile memory device 100 includes a memory element 120. The memory element 120 includes a conductive oxide layer 101, an ion impeding layer, and an electrolytic tunnel barrier layer 105. The layers 101,103 and 105 of the memory element 120 are electrically in series with one another. Preferably, surfaces 101b, 101t, 103t, and 105t of the layers 101, 103, and 105 are substantially planar surfaces or share the same undulations and have substantially uniform thicknesses $t_1$, $t_2$, and $t_3$, respectively.

The conductive oxide layer 101 includes mobile ions 111 that are movable between the electrolytic tunnel barrier layer 105 and the conductive oxide layer 101 in response to an electric field having a predetermined magnitude and direction, as will be described in greater detail below. The conductive oxide layer 101 can be a conductive perovskite. Examples of conductive perovskites include but are not limited to PCMO, LNO, LCMO, LSCO, LSMO, PMO, strontium titanate (STO), and a reduced STO. The thickness $t_3$ of the conductive oxide layer 101 will be application specific. For example, an approximate range of thicknesses can be from about 100 Å to about 300 Å. As one example, the thickness $t_3$ can be approximately 250 Å. The conductive oxide layer 101 can be formed using microelectronics fabrication techniques that are well understood in the semiconductor art for forming thin films. Example fabrication techniques include but are not limited to atomic layer deposition (ALD), chemical vapor deposition (CVD), sputtering, molecular beam epitaxy (MBE), spin-on deposition, pulsed laser deposition, electron-beam (e-beam) deposition, and thermal evaporation.

The ion impeding layer 103 is configured to substantially stop ion movement between the electrolytic tunnel barrier layer 105 and the conductive oxide layer 101 when a voltage that is less than a predetermined magnitude is applied across the memory element 120, as will be described in greater detail below. The material selected for the ion impeding layer 103 will be application dependent. However, suitable materials for the ion impeding layer 103 include but are not limited to $LaAlO_3$, $TiO_X$, $TaO_X$, $AlO_X$, SiC, $SiO_X$, $IrO_X$, MgO, Pt, strontium ruthenate (SRO), and a reduced SRO.

Criteria for selecting the material for ion impeding layer 103 may include but are not limited to a material operative as a mobility barrier to the mobile ions 111, a material having a high activation energy for migration of mobile ions 111 to vacancy sites in the material, a material having stoichiometrically too few sites for migration of the mobile ions 111, and a material having a low conductivity to the mobile ions 111 and having an electrical conductivity that is higher that an electrical conductivity of a material for the electrolytic tunnel barrier layer 105.

The electrolytic tunnel barrier layer 105 is made from an insulating material (e.g., a dielectric material) that allows ion movement. Those skilled in the art will appreciate that the term electronic refers to electron or hole movement, while the term electrical or electrolyte refers to ion movement. Accordingly, an electrolytic tunnel barrier is a material with bulk properties of an electronic insulator that allows ionic movement but is thin enough to allow for electron tunneling. Suitable materials for the electrolytic tunnel barrier layer 105 include but are not limited to yttria-stabilized zirconia (YSZ), $ZrO_2$, $HfO_2$, and $Er_2O_3$. The electrolytic tunnel barrier layer 105 is operative to provide electron tunneling such that the memory element 120 has a non-linear I-V curve and the current flowing through the memory element 120 is a non-linear function of the voltage applied across the memory element 120. Tunneling mechanism for the electrolytic tunnel barrier layer 105 include but are not limited to single step tunneling processes (e.g., direct tunneling, Fowler-Nordheim tunneling, and thermionic field emission tunneling) and multi-step tunneling processes (e.g., trap-assisted tunneling).

The material and thickness $t_1$ for the electrolytic tunnel barrier layer 105 will be application dependent. Preferably, the thickness $t_1$ of the electrolytic tunnel barrier layer 105 is approximately 100 Å or less. More preferably, the thickness $t_1$ is approximately 50 Å or less. For example, the thickness $t_1$ can be approximately 25 Å. If the electrolytic tunnel barrier layer 105 is too thick, tunneling may not occur or the voltage across the memory element 120 necessary for tunneling may be too high. For example, currents generated by the applied voltage may exceed current density limitations of the memory element and/or conductive array lines, the resulting electric field generated by the applied voltage may exceed breakdown limits of the thin film materials in the memory element, or the magnitude of the applied voltage may require driver circuitry that exceeds an area budget for a memory design. The thickness $t_2$ for the ion impeding layer 103 is approximately no greater than the thickness $t_1$ for the electrolytic tunnel barrier layer 105 (e.g., $t_2 \leq t_1$). If the ion impeding layer 103 is too thick, device currents may be too low and/or the mobile ions 111 may not be able to travel through the ion impeding layer 103. For example, the thickness $t_2$ for the ion impeding layer 103 can be approximately 20 Å. As another example, if the ion impeding layer 103 is made from silicon carbide (SiC), then the thickness $t_2$ can be approximately 10 Å. The ion impeding layer 103 and the electrolytic tunnel barrier layer 105 may be formed using the fabrication techniques described above for the conductive oxide layer 101.

Figure 2A:
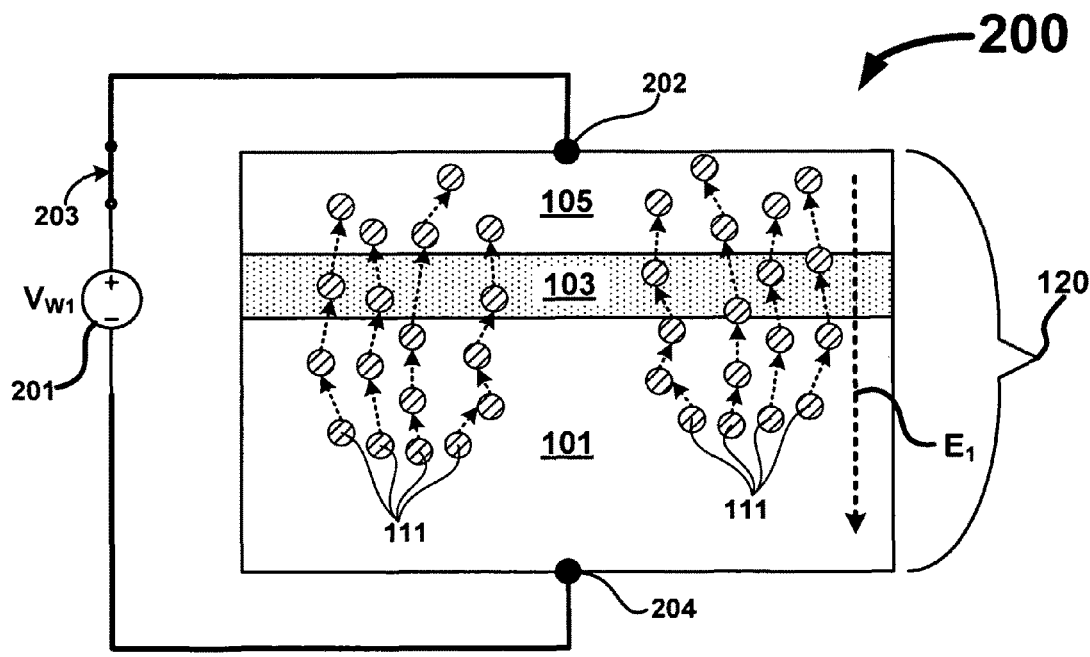
FIG. 2A depicts a memory element switching from a first conductivity profile to a second conductivity profile.

Referring again to FIG. 1, the memory element 120 stores data as a plurality of conductivity profiles (e.g., resistive states). One of the conductivity profiles may be indicative of a first resistive state (e.g., a logic 1 or an erased state) and another one of the conductivity profiles may be indicative of a second resistive state (e.g., a logic 0 or a programmed state). For example, in FIG. 1 the mobile ions 111 are positioned in the conductive oxide layer 101 and the memory element 120 can store data as the first conductivity profile (e.g., erased state or logic 1). Turning now to FIG. 2A, a first write configuration 200 includes a voltage source 201 operative to apply a first write voltage $V_{W1}$ across the memory element 120. A switch 203 is connected with the voltage source 201 and is operative to apply the first write voltage $V_{W1}$ across the memory element 120. Conversely, when the switch 203 is open the first write voltage $V_{W1}$ is no longer applied across the memory element 120. As depicted in FIG. 2A, the switch 203 is closed so that the first write voltage $V_{W1}$ is applied across the memory element 120 at nodes 202 and 204. A magnitude and polarity of the first write voltage $V_{W1}$ is operative to generate a first electric field $E_1$ having a magnitude sufficient to cause a quantity of the mobile ions 111 to move from the conductive oxide layer 101, through the ion impeding layer 103, and into the electrolytic tunnel barrier layer 105. Those skilled in the art will appreciate that the first electric field $E_1$ has a plurality of magnitudes depending on the dielectric constant and conductivity of the specific materials being used for the memory element 120. Based on the direction of the first electric field $E_1$ and on the direction of movement of the mobile ions 111, the mobile ions 111 depicted in FIG. 2A have a negative charge and move in a direction that is opposite that of the first electric field $E_1$. For example, the mobile ions 111 can be negatively charged oxygen ions (O$^-$). However, the charge of the mobile ions 111 is not limited to negatively charge species of ions and in some applications the mobile ions 111 may be positively charged ions.

Figure 2B:
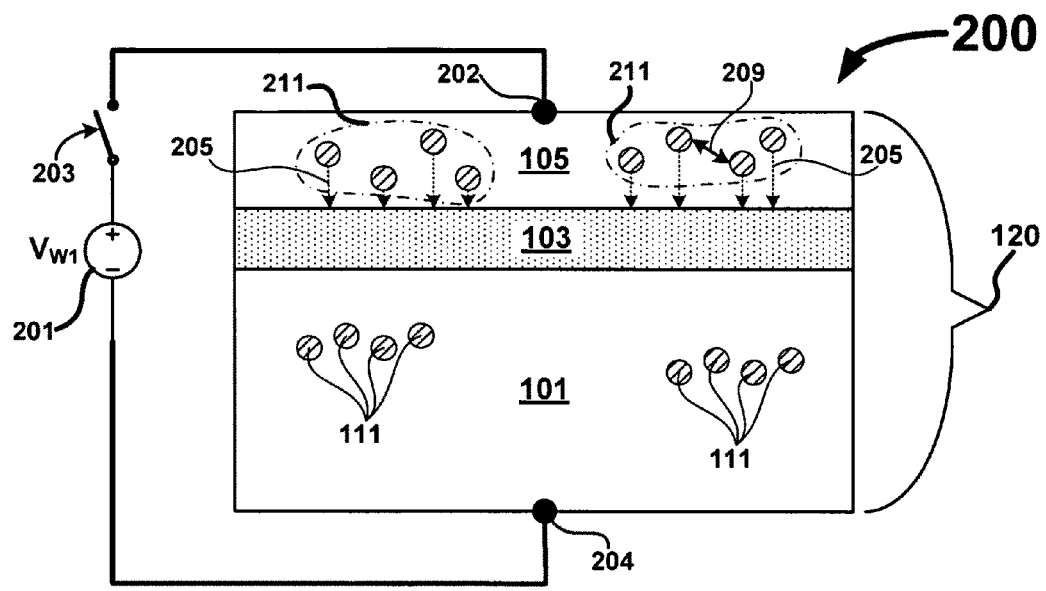
FIG. 2B depicts a memory element having the second conductivity profile.

Moving now to FIG. 2B, a quantity 211 of the mobile ions 111 have moved from the conductive oxide layer 101, through the ion impeding layer 103, and into the electrolytic tunnel barrier layer 105 after the first electric field $E_1$ was applied. Reference to a quantity may include some or all of the mobile ions 111. The switch 203 is opened and the first write voltage $V_{W1}$ is no longer applied across the memory element 120. The ion impeding layer 103 is operative to substantially stop (see dashed arrows 205) the quantity 211 from moving back through the ion impeding layer 103 and into the conductive oxide layer 101 unless a write voltage having a sufficient magnitude and polarity (e.g., a second write voltage as will be described below) is applied across the memory element 120. In FIG. 2B, the voltage applied across the memory element 120 is substantially 0V; however, as will be described below, a read voltage having a magnitude that is less than the write voltage can be applied across the memory element 120. The ion impeding layer 103 is further operative to substantially stop movement of the quantity 211 when the read voltage is applied across nodes (202, 204). Moreover, when the memory element 120 is half-selected such that a half-select voltage is applied across the nodes (202, 204) the ion impeding layer 103 is also operative to substantially stop movement of the quantity 211. It should be appreciated by those skilled in the art that the term "quantity" refers only to those ions that are impeded by the ion impeding layer 103 and not any ions that may not be impeded.

Figure 2C:
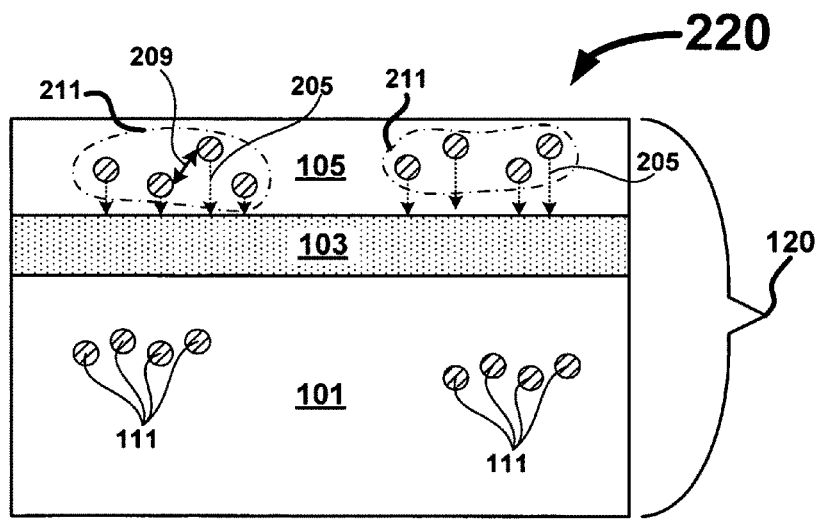
FIG. 2C depicts retention of the second conductivity profile.

The relocation of the mobile ions 111 in the conductive oxide layer 101 to the electrolytic tunnel barrier layer 105 (i.e., quantity 211) results in a change in electrical conductivity of the memory element 120 such that its conductivity profile is switched from the first conductivity profile present in FIG. 1 to a second conductivity profile present in FIGS. 2B and 2C. Accordingly, the application of the first write voltage $V_{W1}$ has effectuated a writing of new data to the memory element 120 and the second conductivity profile is indicative of the new data. In one embodiment, the second conductivity profile is indicative of a logic 0 or a programmed state of the memory element 120.

Referring to FIG. 2C., in a configuration 220, the memory element 120 is depicted with the quantity 211 still positioned in the electrolytic tunnel barrier layer 105 such that the memory element stores data as the second conductivity profile. The voltage source 201, the switch 203, and their connection with nodes (202, 204) are not depicted. However, like the configuration 200 depicted in FIG. 2B, the stored data (e.g., the second conductivity profile) is retained in the absence of power. The memory element 120 may be one of a plurality of memory elements 120 in a non-volatile memory device, such as a removable memory device (e.g., a SD card or USB Thumb Drive). Therefore, the configuration 200 may represent the non-volatile memory device when it is inserted into a host system and the configuration 220 may represent the non-volatile memory device when it is removed from the host system. In either case, the ion impeding layer 103 is operative to improve retention of stored data in each of the plurality of memory elements 120 in the memory device. Consequently, data retention, that is, the ability of the memory element 120 to retain stored data over a period of time in the absence of power, is enhanced by the ion impeding layer 103.

Turning now to FIG. 3A, a second write configuration 300 includes a voltage source 301 configured to apply a second write $V_{W2}$ voltage across the memory element 120 at nodes (202, 204). Prior to the application of the second write voltage $V_{W2}$, the memory element 120 stores data as the second conductivity profile. A switch 303 is closed and the second write voltage $V_{W2}$ generates a second electric filed $E_2$ having a magnitude sufficient to move the quantity 211 from the electrolytic tunnel barrier layer 105, through the ion impeding layer 103, and back into the conductive oxide layer 101. Based on the direction of the second electric filed $E_2$ and the direction of movement of the quantity 211, the mobile ions 111 have a negative charge.

Moving now to FIG. 3B, the switch 303 is open; however, the application of the second write voltage $V_{W2}$ has reversibly switched the conductivity profile of the memory element 120 from the second conductivity profile (e.g., logic 0 or programmed state) to the first conductivity profile (e.g., logic 1 or erased state) and the quantity 211 that was previously disposed in the electrolytic tunnel barrier layer 105 has moved through the ion impeding layer 103 and into the conductive oxide layer 101. The mobile ions now reside in the conductive oxide layer 101 and are denoted as quantity 311. The re-introduction of the quantity 311 back into the conductive oxide layer 101 changes the conductivity profile of the memory element 120. Consequently, the application of the second write voltage $V_{W2}$ has effectuated a writing of new data to the memory element 120. The ion impeding layer 103 is operative to substantially stop 305 the quantity 311 from moving back through the ion impeding layer 103 and into the electrolytic tunnel barrier layer 105 when a voltage having a magnitude that is less than the first or second write voltages ($V_{W1}$, $V_{W2}$) is applied across the memory element 120. As was described above, the ion impeding layer 103 is further operative to substantially stop ion movement across the ion impeding layer 103 when the voltage applied across the memory element 120 is a read voltage or a half-select voltage.

Referring now to FIG. 3C, a configuration 320 depicts the memory element without the power source 301. In the configuration 320, the ion impeding layer 103 is operative to substantially stop ion motion such that the first conductivity profile is retained in the absence of power. As was described above, the configurations depicted in FIGS. 3B and 3C may represent a non-volatile memory device when it is inserted and removed from a host system, respectively. Accordingly, the application of the first write voltage $V_{W1}$, followed by the application of the second write voltage $V_{W2}$, has returned the memory element 120 to the first conductivity profile depicted in FIG. 1. Although not depicted, a re-application of the first write voltage $V_{W1}$ to the configuration depicted in FIG. 3C will reversibly switch the first conductivity profile to the second conductivity profile depicted in FIGS. 2B and 2C.

Figure 4A:
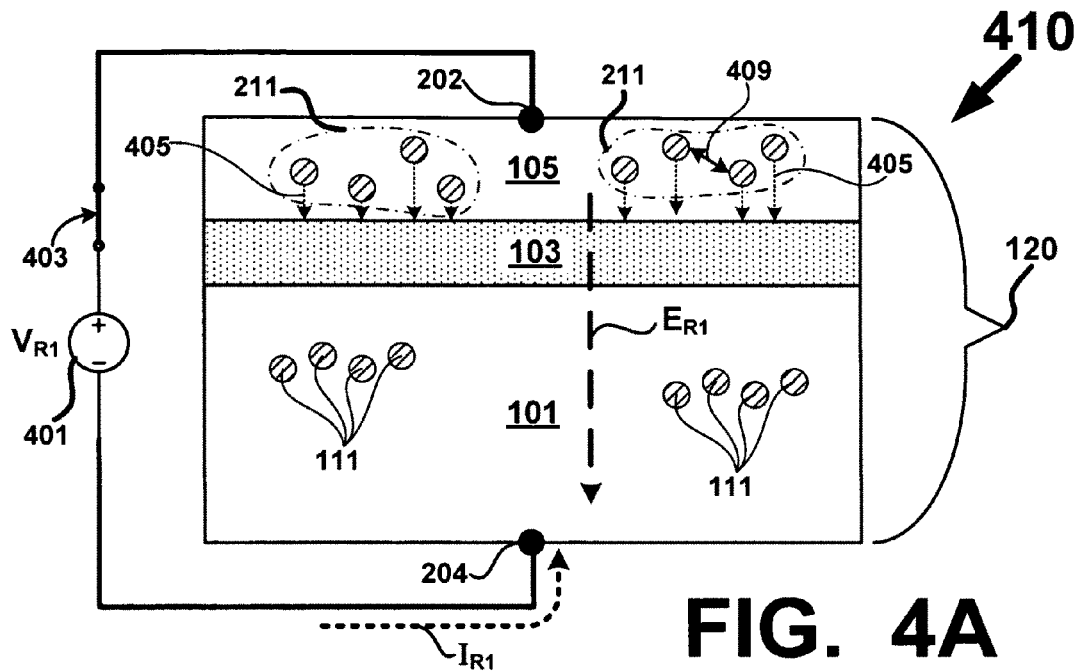
FIG. 4A depicts a memory element having a second conductivity profile that is unaffected by application of a first read voltage.
Figure 4B:
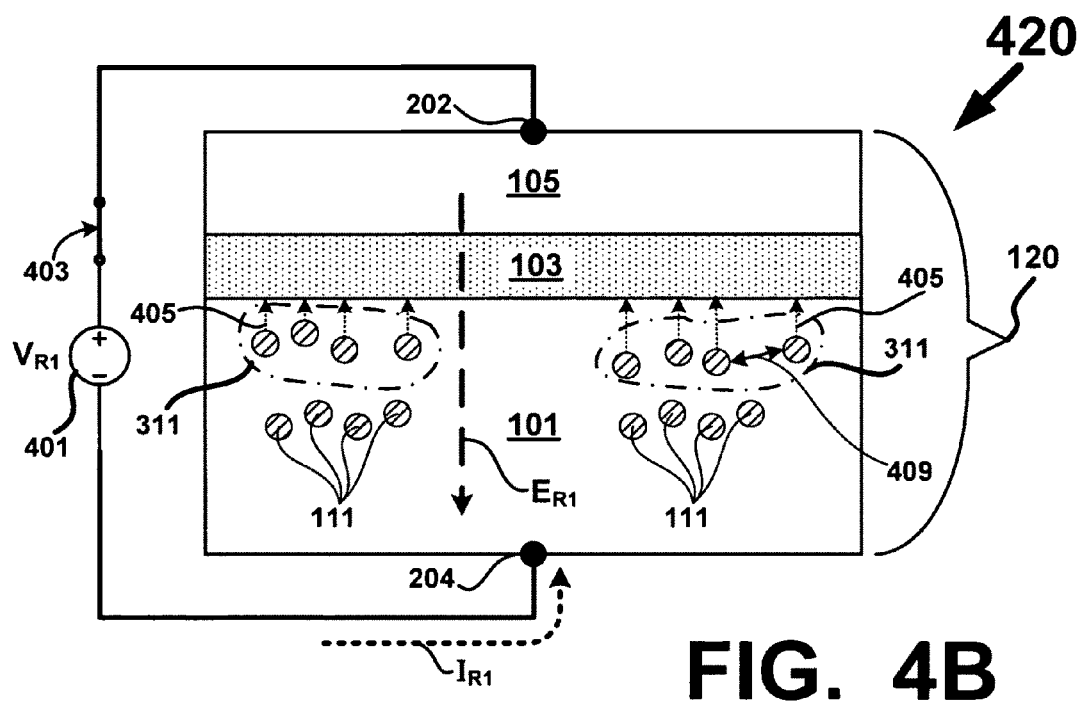
FIG. 4B depicts a memory element having a first conductivity profile that is unaffected by application of the first read voltage.
Figure 4C:
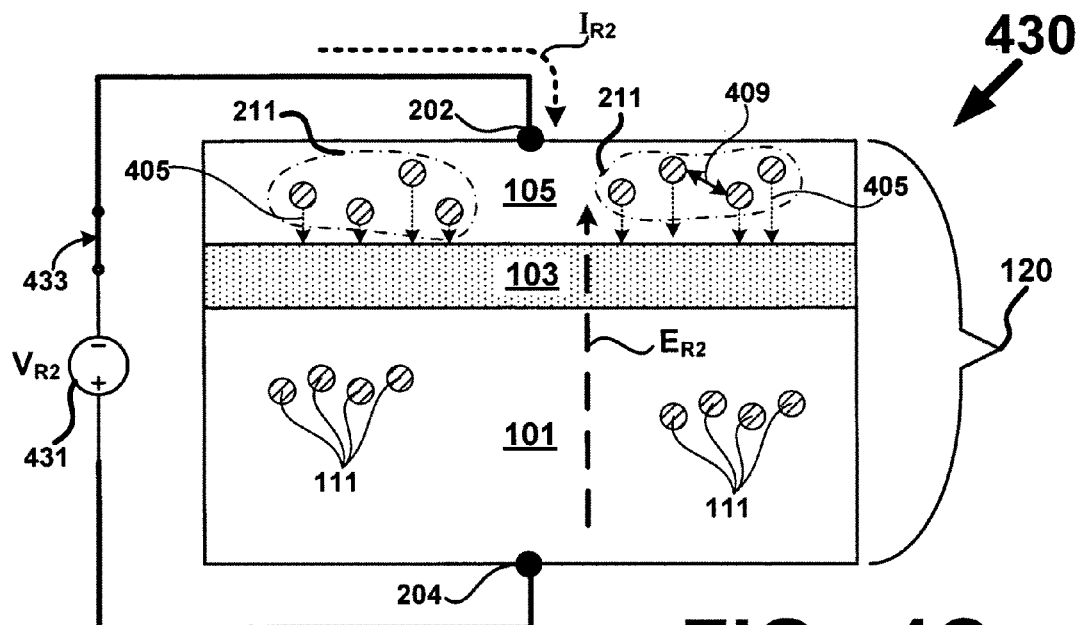
FIG. 4C depicts a memory element having a second conductivity profile that is unaffected by application of a second read voltage.
Figure 4D:
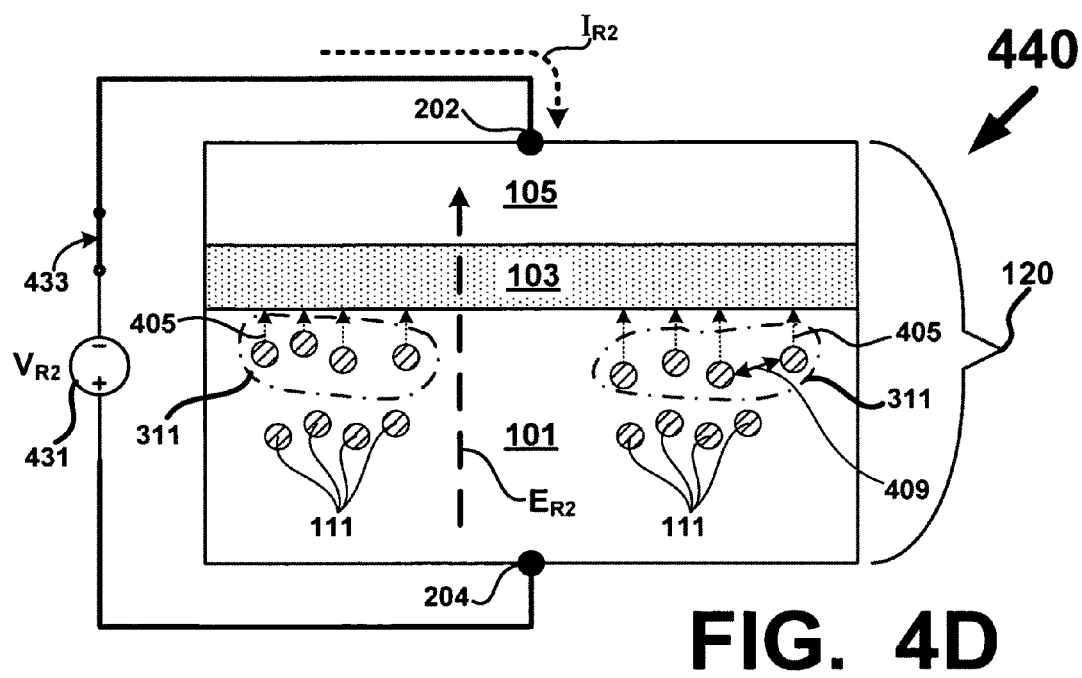
FIG. 4D depicts a memory element having a first conductivity profile that is unaffected by application of the second read voltage.

Reference is now made to FIGS. 4A through 4D where a read voltage is applied across the memory element 120 at nodes (202, 204). FIGS. 4A and 4B depict a voltage source 401 for generating a read voltage $V_{R1}$ having a first polarity and FIGS. 4C and 4D depict a voltage source 431 for generating a read voltage $V_{R2}$ having a second polarity that is opposite the first polarity. Regardless of read voltage polarity, a magnitude of the read voltage is less than the magnitude of the write voltage ($V_{W1}$, $V_{W2}$) in order to prevent previously stored data from being overwritten. For example, if the magnitude of the write voltages ($V_{W1}$, $V_{W2}$) is approximately 4V, then the magnitude of the read voltage can be approximately 1.5V. In some applications, the read voltage will be applied with only one polarity. In other applications, the polarity of the read voltage may be alternated (e.g., +$V_R$ and −$V_R$). For example, approximately half of the read operations are effectuated using a first polarity and approximately half of the read operations are effectuated using a second polarity.

Referring again to FIGS. 4A and 4B, in configurations 410 and 420, a switch 403 connected with the voltage source 401 applies the first read voltage $V_{R1}$ across the memory element 120. As a result, an electric field $E_{R1}$ and a read current $I_{R1}$ are generated. A magnitude of the read current $I_{R1}$ is indicative of the value (i.e., resistive state) of data stored in the memory element 120. In FIG. 4A data is stored as the second conductivity profile and in FIG. 4B data is stored as the first conductivity profile. Depending on the application, conventions such as logic 0 and logic 1, or programmed and erased, may be associated with the conductivity profiles. The ion impeding layer 103 is operative to substantially stop (see dashed arrows 405) ion movement between the electrolytic tunnel barrier layer 105 and the conductive oxide layer 101 as depicted in FIG. 4A and to prevent ion movement from the conductive oxide layer 101 and into the electrolytic tunnel barrier layer 105 as depicted in FIG. 4B. Consequently, the first and second conductivity profiles are not corrupted or disturbed by the application of the first read voltage $V_{R1}$.

Turning now to FIGS. 4C and 4D, the polarity of the read voltage $V_{R2}$ is reversed. In configurations 430 and 440, a switch 433 is connected with a voltage source 431 that applies the second read voltage $V_{R2}$ across the memory element 120. The read voltage $V_{R2}$ generates an electric field $E_{R2}$ and a read current $I_{R2}$ that are opposite in direction to the electric field $E_{R1}$ and the read current $I_{R1}$ depicted in FIGS. 4A and 4B. Nevertheless, the ion impeding layer 103 is operative to substantially stop (see dashed arrows 405) ion movement from the electrolytic tunnel barrier layer 105 and back into the conductive oxide layer 101 as depicted in FIG. 4C where the memory element 120 stores data as the second conductivity profile. Similarly, ion impeding layer 103 is operative to substantially stop ion movement from the conductive oxide layer 101 and into the electrolytic tunnel barrier layer 105 as depicted in FIG. 4D where the memory element 120 stores data as the first conductivity profile. Consequently, the first and second conductivity profiles are not corrupted or disturbed by the application of the second read voltage $V_{R2}$.

Depending on the charge or ionization state of the mobile ions 111, the direction of the electric field can enhance data retention. In FIGS. 4A and 4D, assuming the mobile ions (211, 311) are negatively charged, the electric fields ($E_{R1}$, $E_{R2}$) are operative to displace the mobile ions away from the ion impeding layer 103 thereby aiding the ion impeding layer 103 in substantially stopping ion movement. In contrast, the electric fields ($E_{R1}$, $E_{R2}$) in FIGS. 4B and 4C are operative to displace the mobile ions (311, 211) towards the ion impeding layer 103. Accordingly, the ion impeding layer 103 must be configured to substantially stop the ion movement in the worst case scenario where the charge of the ion species and the direction of the electric field displace the mobile ions towards the ion impeding layer 103. Although the above discussion focused on electric fields generated by read voltages, the same principles apply when the applied voltage is a half-select voltage, because in both cases ion motion is substantially stopped. On the other hand, in the case where the applied voltage is a write voltage, ion movement is necessary to effectuate the switching of the conductivity profile of the memory element 120. Additionally, the ion impeding layer 103 is operative to substantially stop ion movement of the quantity of mobile ions that may be caused by internal electric fields and concentration gradients caused by ion build-up in the electrolytic tunnel barrier layer 105 and/or the conductive oxide layer 101.

Referring again to FIGS. 4A through 4D, the ion impeding layer 103 is also operative to substantially stop ion movement due to electrostatic charge repulsion 409 between ions 211 or 311 as depicted by arrows 409. For example, ions that are in close proximity to one another and having identical charges will repel one another with varying amounts of force. Absent the ion impeding layer 103, the repelling force can cause some of the mobile ions 211 or 311 to move (e.g., drift) between the conductive oxide layer 101 and the electrolytic tunnel barrier layer 105. Over time, that movement of ions will increase or decrease the conductivity of the conductive oxide layer 101 and corrupt the value of stored data in the memory element 120. The mutual repulsion occurs even when no voltages are applied across the memory element 120.

Although the forgoing discussion has disclosed ions with negative ionization state, the ionization state of the ions is application dependent and the material selected for the memory element 120 can include materials configured to operate with ions having a positive ionization state.

Figure 5:
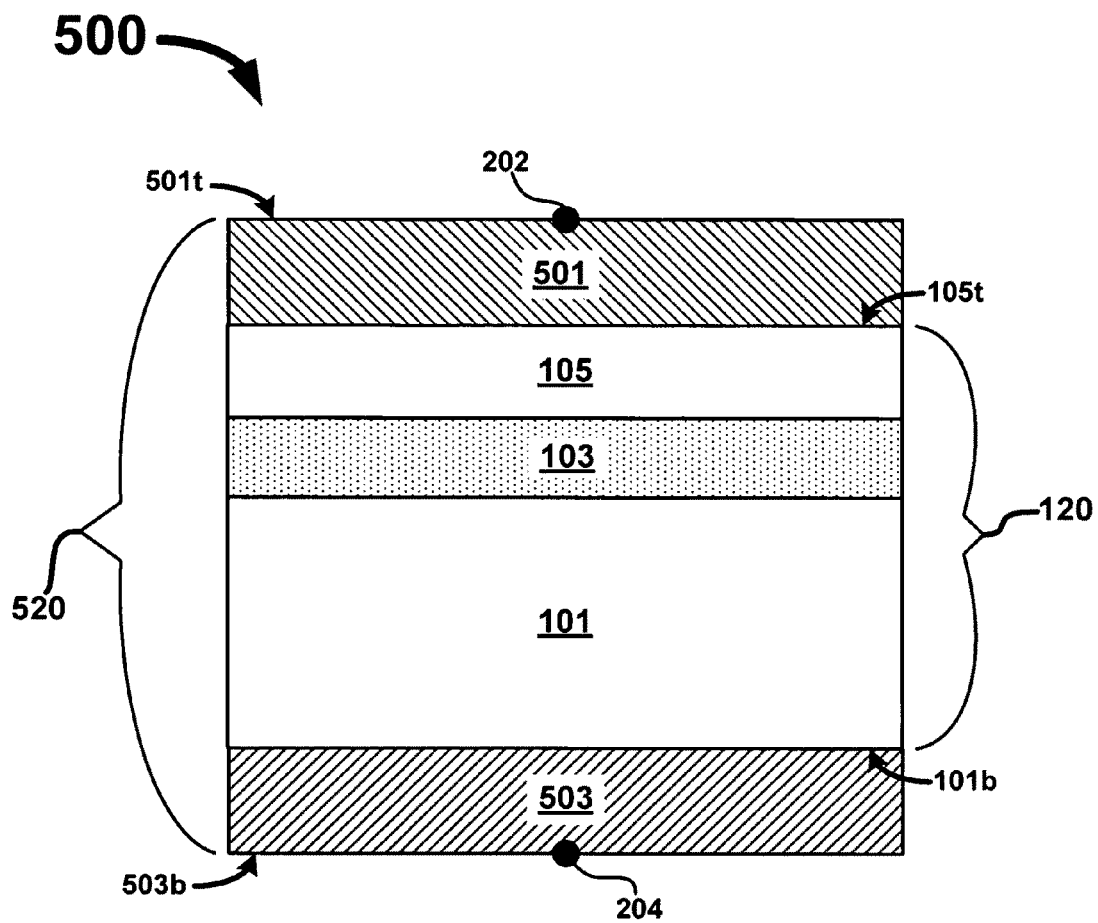
FIG. 5 depicts a memory element electrically in series with and sandwiched by a pair of electrodes.

Reference is now made to FIG. 5 where a configuration 500 includes a pair of electrodes 501 and 503 that sandwich the memory element 120. The memory element 120 is electrically in series with the pair of electrodes (501, 503). The electrode 501 is in contact with the electrolytic tunnel barrier layer 105 and the electrode 503 is in contact with the conductive oxide layer 101. The aforementioned read, write, and half-select voltages can be applied across the memory element 120 by connecting the voltage sources with the nodes (202, 204). The pair of electrodes (501, 503) may be made from an electrically conductive material including but not limited to a metal, a metal alloy, platinum (Pt), tungsten (W), aluminum (Al), and a conductive oxide material. Although not depicted in FIG. 5, additional thin film layers may be positioned between the electrodes (501, 503) and the layers of the memory element 120. Those layers include but are not limited to glue layers, diffusion barriers, adhesion layers, anti-reflection layers, and the like. For example, an adhesion layer may be positioned between a surface 101$b$ of the conductive oxide layer 101 and the electrode 503 to promote adhesion between the materials of the electrode 503 and the conductive oxide layer 101. Similarly, a glue layer may be positioned between a surface 105$t$ of the electrolytic tunnel barrier layer 105 and the electrode 501. In that the memory element 120 is electrically in series with the pair of electrodes (501, 503) that sandwich it, the combination forms a memory element 520 where voltages for data operations (e.g., read and write voltages) may be applied to nodes (202, 204).

Figures 6A, 6B:
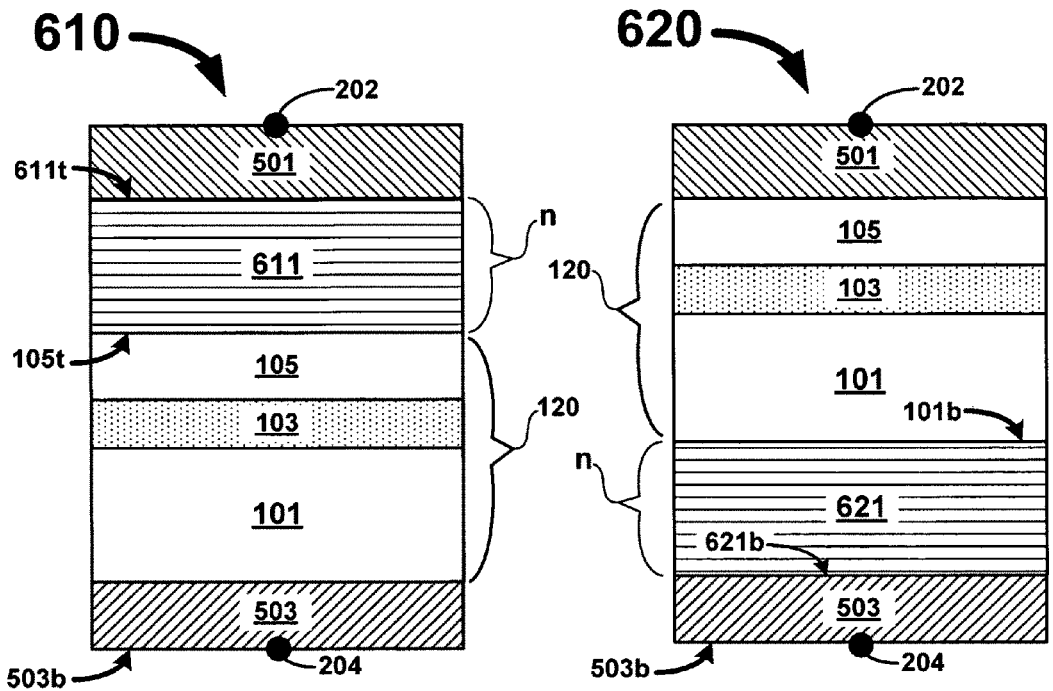
FIG. 6A depicts a non-ohmic device and a memory element that are electrically in series with and sandwiched between a pair of electrodes.
FIG. 6B depicts an alternate configuration of a non-ohmic device and a memory element that are electrically in series with and sandwiched between a pair of electrodes.

Moving now to FIGS. 6A and 6B, configurations 610 and 620 include a non-ohmic device 611 and 621 respectively. The non-ohmic devices 611 and 621 are sandwiched between the pair of electrodes (501, 503) and are electrically in series with the memory element 120 and the pair of electrodes (501, 503). As was discussed above, each memory element 120 stores data as a plurality of conductivity profiles with discrete resistances at certain voltages. Therefore, each memory element 120 can be schematically depicted as a resistor that is electrically in series with the non-ohmic devices 611 and 621. A resistance at a certain voltage of a specific memory element 120 is indicative of a value of stored data in that memory element 120. As an example, each memory element 120 can store a single bit of data as one of two distinct conductivity profiles having a first resistive state $R_0$ at a read voltage $V_R$ indicative of a logic "0" and a second resistive state $R_1$ at $V_R$ indicative of a logic "1", where $R_0 \neq R_1$. Preferably, a change in conductivity, measured at the read voltage $V_R$, between $R_0$ and $R_1$ differs by a large enough factor so that a sense unit that is electrically coupled with the memory element 120 can distinguish the $R_0$ state from the $R_1$ state. For example, the factor can be at least a factor of approximately 5. Preferably, the predetermined factor is approximately 10 or more (e.g., $R_0 \approx 1 M\Omega$ and $R_1 \approx 100$ k$\Omega$). The larger the predetermined factor is, the easier it is to distinguish between resistive states $R_0$ and $R_1$. Furthermore, large predetermined factors may also allow intermediate resistive states (e.g., $R_{00}$, $R_{01}$, $R_{10}$, and R11).

The resistance of the memory element 120 may not be a linear function of the voltage applied across the memory element 120 at the nodes (202, 204). Therefore, a resistance $R_S$ of the memory elements 120 can approximately be a function of the applied voltage V such that $R_S \approx f(V)$. The applied voltage V can be a read voltage, a write voltage, or a half-select voltage. Moreover, because the non-ohmic devices 611 and 621 are electrically in series with the memory element 120, a resulting series resistance creates a voltage drop across the non-ohmic devices 611 and 621 such that the actual voltage across the memory element 120 will be less than the voltage applied across the nodes (202, 204). As one example, if the read voltage $V_R \approx 3V$ and the voltage drop across the non-ohmic devices 611 and 621 is approximately 2.0V, then an effective read voltage across the memory element 120 is approximately 1.0V.

The non-ohmic devices 611 and 621 create a non-linear I-V characteristic curve that falls within a desired operational current-voltage range for data operations (e.g., read and write operations) to the memory element 120. The non-ohmic devices 611 and 621 substantially reduce or eliminate current flow when the memory element 120 is not selected for a read or write operation. The non-ohmic devices 611 and 621 allow data to be written to the memory element 120 when a write voltage $V_W$ of appropriate magnitude and polarity is applied across the nodes (202, 204) of a selected memory element 120. Similarly, the non-ohmic devices 611 and 621 allow data to be read from the memory element 120 when a read voltage $V_R$ of appropriate magnitude and polarity is applied across the nodes (202, 204) of a selected memory element 120. An additional function of the non-ohmic devices 611 and 621 is to substantially reduce or eliminate current flow through half-selected and un-selected memory elements 120.

The non-ohmic devices 611 and 621 may include a plurality of layers of thin film materials that are in contact with one another and are denoted as n in FIGS. 6A and 6B. Those layers can include a pair of electrodes that sandwich one or more layers of a dielectric material. The dielectric material(s) are operative as a tunnel barrier layer(s) that generate the non-linear I-V characteristic of the non-ohmic devices 611 and 621. As one example, the non-ohmic devices 611 and 621 can comprise a sandwich of Pt electrode/TiO$_x$ dielectric layer/Pt electrode. The thicknesses of the Pt and TiO$_x$ materials will be application dependent. The Pt electrodes may have a thickness in a range from about 500 Å to about 100 Å, for example. The TiO$_x$ dielectric layer may have a thickness in a range from about 50 Å to about 20 Å, for example. Examples of suitable materials for the dielectric layers for the non-ohmic devices 611 and 621 include but are not limited to $SiO_2$, $Al_2O_3$, $SiN_x$, $HfSiO_x$, $ZrSiO_x$, $Y_2O_3$, $Gd_2O_3$, $LaAlO_3$, $HfO_2$, $ZrO_2$, $Ta_2O_5$, TiO$_x$, yttria-stabilized zirconia (YSZ), $Cr_2O_3$, and $BaZrO_3$. Suitable materials for the electrically conductive layers for the electrodes of the non-ohmic devices 611 and 621 include but are not limited to metals (e.g., aluminum Al, platinum Pt, palladium Pd, iridium Ir, gold Au, copper Cu, tantalum Ta, tantalum nitride TaN, titanium (Ti), and tungsten W), metal alloys, refractory metals and their alloys, and semiconductors (e.g., silicon Si).

Alternatively, the non-ohmic devices (611, 621) can include a pair of diodes connected in a back-to-back configuration (not shown), for example. Each of the diodes can be manufactured to only allow current to flow in a certain direction when its breakdown voltage (of a predetermined magnitude and polarity) is reached.

In FIG. 6A, the non-ohmic device 611 is positioned adjacent to electrode 501; whereas, in FIG. 6B, the non-ohmic device 621 is positioned adjacent to electrode 503. In some applications, the material for the pair of electrodes (501, 503) will be compatible with the electrode material for the non-ohmic devices 611 and 621. In those applications, one of the pair of electrodes (501, 503) can serve as one of the electrodes for the non-ohmic devices 611 and 621.

Figure 7A:
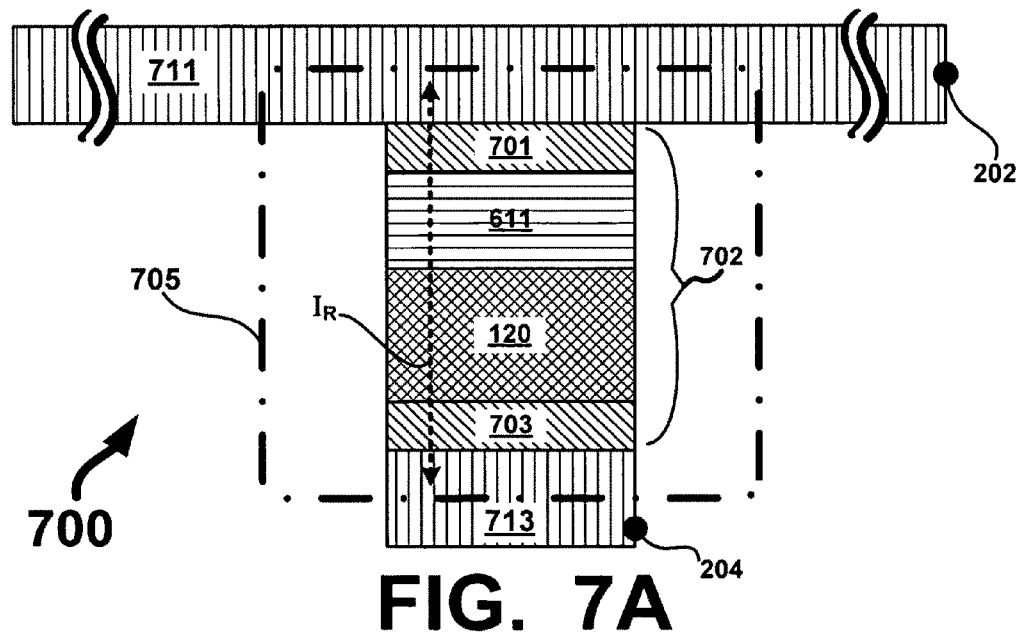
FIG. 7A depicts a portion of a non-volatile two-terminal cross-point array including a non-volatile memory plug electrically in series with a first conductive array line and a second conductive array line.

Reference is now made to FIG. 7A, where a non-volatile memory device 700 includes a plurality of first conductive array lines 711 (one is depicted) and a plurality of second conductive array lines 713 (one is depicted), and a plurality memory plugs 702 (one is depicted). Each memory plug 702 includes a first terminal 701 in electrical communication with only one of the first conductive array lines 711 and a second terminal 703 in electrical communication with only one of the second conductive array lines 713. Each memory plug 702 includes a memory element 120 that is electrically in series with the first and second terminals (701, 703) and the layers 101, 103, and 105 of the memory element 120 are electrically in series with one another. The first and second terminals (701, 703) can be the pair of electrodes (501, 503) described in reference to FIGS. 5, 6A, and 6B. As depicted in FIG. 7A, the memory plug 702 may include the above mentioned non-ohmic devices, such as the device 611 or the device 613 (not shown). The non-ohmic device is electrically in series with the first and second terminals (701, 703) and with the memory element 120. The position of the non-ohmic device in the memory plug 702 may be as depicted (e.g., device 611) or the non-ohmic device can be positioned between the second terminal 703 and the memory element 120. Although, non-ohmic device 611 is depicted, the memory plug 702 need not include a non-ohmic device and the first terminal 701 may be in contact with the memory element 120.

Although a coordinate system is not depicted, the first conductive array lines 711 may be substantially aligned with a X-axis (e.g., running from left to right on the drawing sheet) and the second conductive array lines 713 may be substantially aligned with a Y-axis (e.g., looking into the drawing sheet). The aforementioned read and write and voltages are applied to a selected memory plug 702 by applying the voltages across the two conductive array lines that the memory plug 702 is positioned between. In FIG. 7A, by applying the read and write and voltages at the nodes (202, 204) stored data can be read from the selected memory plug 702 or new data can be written to the selected memory plug 702. A read current $I_R$ flows through the selected memory plug 702, the memory element 120, and the non-ohmic device (611 or 613) if it is included in the memory plug 702. The direction of flow of the read current $I_R$ (e.g., substantially along a Z-axis) will depend on the polarity of the read voltage. For example, if a positive read voltage potential is applied to the node 202 and a negative read voltage potential is applied to the node 204, then the read current $I_R$ will flow from the first conductive array line 711 to the second conductive array lines 713. In some applications, a memory cell 705, the repeatable unit that makes up the array, may include all or a portion of the conductive array lines (711, 713) as denoted by the dashed line for the memory cell 705.

Figure 7B:
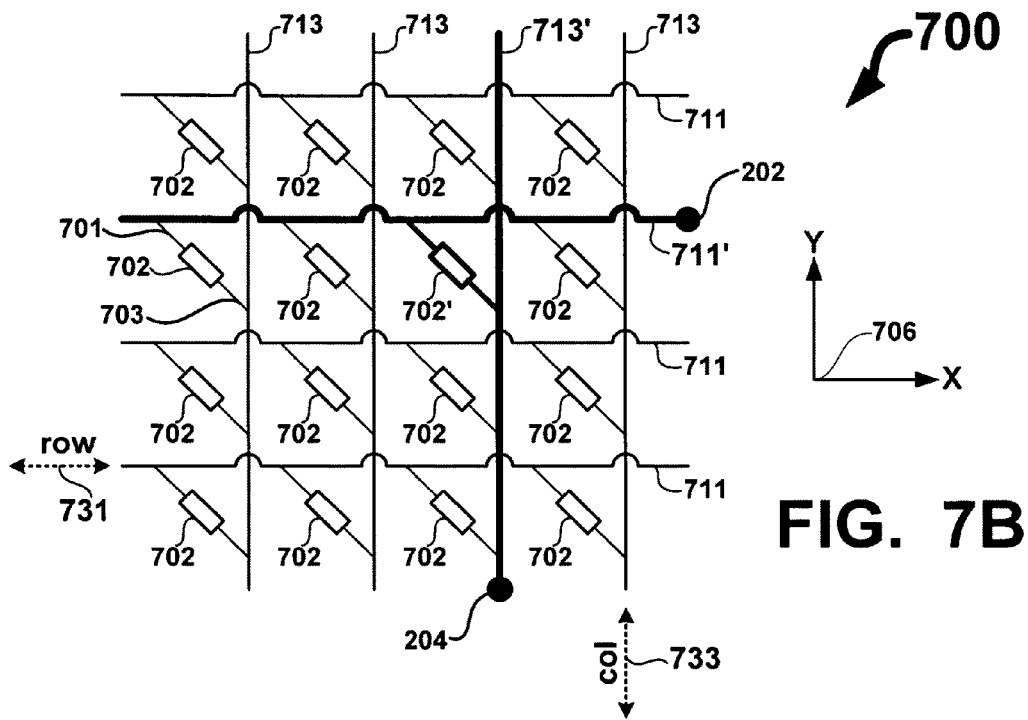
FIG. 7B depicts a schematic view of a non-volatile two-terminal cross-point array that includes a plurality of memory plugs.

Turning now to FIG. 7B, schematic view of the non-volatile memory device 700 includes the plurality of first and second conductive array lines (711, 713) and a plurality of the memory plugs 702 connected with the plurality of first and second conductive array lines (711, 713) by their respective first and second terminals (701, 703). The plurality of first conductive array lines 711 are substantially aligned with the X-axis and define a row direction (row 731) and the plurality of second conductive array lines 713 are substantially aligned with the Y-axis and define a column direction (col 733). Preferably, the first and second conductive array lines (711, 713) are arranged substantially orthogonal to each other. Conductive array lines 711' and 713' are selected array lines because a read or write voltage is applied to those lines at nodes (202, 204) to select memory plug 702' for a data operation (e.g., read or write operation).

Figure 7C:
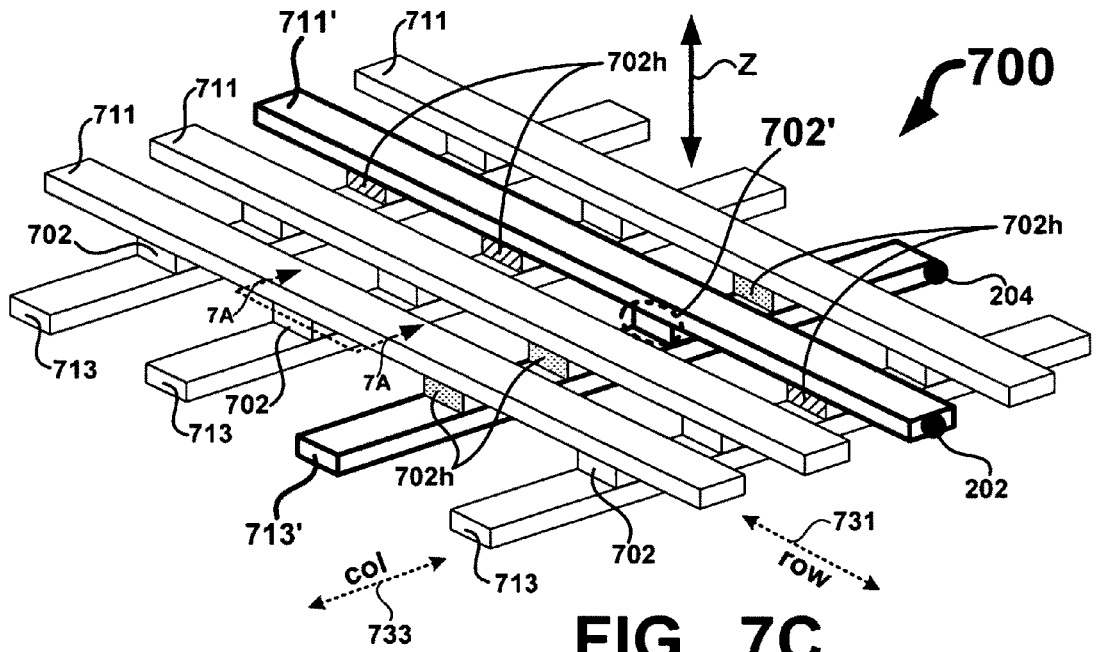
FIG. 7C depicts selected, half-selected, and un-selected memory plugs in a non-volatile two-terminal cross-point array.

In FIG. 7C, the non-volatile memory device 700 includes the selected memory plug 702' positioned at the intersection of selected conductive array lines 711' and 713'. Memory plugs 702 that are only connected with one of the selected conductive array lines (711' and 713') are denoted as half-selected memory plugs 702h. The remaining memory plugs 702 in the memory device 700 are un-selected memory plugs 702 because there respective first and second terminals (701, 703) are connected with conductive array lines that are not at a read or write voltage potential. It should be noted that the memory plug 702 identified with dashed line 7A-7A is depicted in cross-sectional view in FIG. 7A. As was described above, the memory plugs 702 may or may not include a non-ohmic device.

Figure 8A:
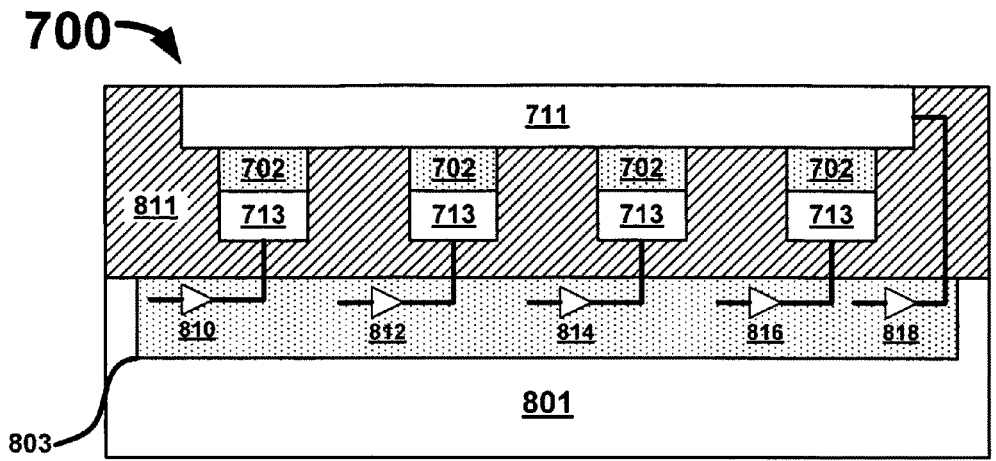
FIG. 8A is a cross-sectional view depicting a non-volatile two-terminal cross-point array positioned over a substrate that includes active circuitry.

Referring now to FIG. 8A, the non-volatile memory device 700 includes a substrate 801 that includes active circuitry 803 that is fabricated on the substrate 801. As one example, the substrate 801 can be a silicon (Si) wafer and the active circuitry can be microelectronic devices formed on the substrate 801 using a CMOS fabrication process. The memory plugs 702 and their respective conductive array lines (711, 713) can be fabricated on top of the active circuitry 803 in the substrate 801. Those skilled in the art will appreciate that an inter-level interconnect structure (not shown) can electrically couple the conductive array lines (711, 713) with the active circuitry 803 which may include several metal layers. For example, vias can be used to electrically couple the conductive array lines (711, 713) with the active circuitry 803. The active circuitry 803 may include but is not limited to address decoders, sense amps, memory controllers, data buffers, direct memory access (DMA) circuits, voltage sources for generating the read and write voltages, just to name a few. Active circuits 810-818 can be configured to apply the select voltage potentials (e.g., read and write voltage potentials) to selected conductive array lines (711, 713). Moreover, active circuits coupled with the conductive array lines (711, 713) can be used to sense the read current $I_R$ from selected memory elements 120 during a read operation and the sensed current can be processed to determine the conductivity profiles (e.g., the resistive state) of the selected memory elements 120. In some applications, it may be desirable to prevent un-selected array lines (711, 713) from floating. The some of the active circuits can be configured to apply an un-select voltage potential (e.g., approximately a ground potential) to the un-selected array lines (711, 713). A dielectric material 811 (e.g., $SiO_2$) may be used where necessary to provide electrical insulation between elements of the non-volatile memory device 700.

Figure 8B:
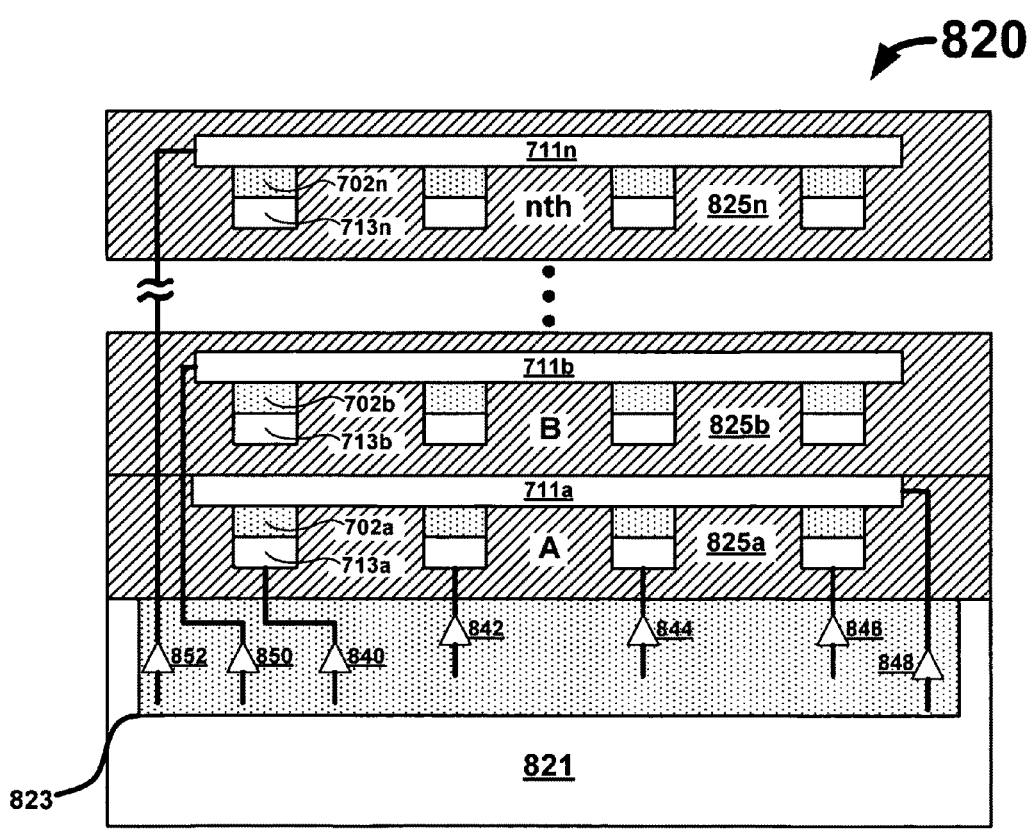
FIG. 8B is a cross-sectional view depicting a stacked non-volatile two-terminal cross-point array positioned over a substrate that includes active circuitry.

In FIG. 8B, a non-volatile memory device 820 includes a plurality of non-volatile memory arrays that are vertically stacked above one another (e.g., along the Z-axis) and are positioned above a substrate 821 that includes active circuitry 823. The non-volatile memory device 820 includes vertically stacked memory layers A and B and may include additional memory layers up to an nth memory layer. The memory layers A, B, . . . through the nth layer can be electrically coupled with the active circuitry 823 in the substrate 821 by an inter-level interconnect structure as was described above. Layer A includes memory plugs 702a and first and second conductive array lines (711a, 713a), Layer B includes memory plugs 702b and first and second conductive array lines (711b, 713b), and if the nth layer is implemented, then the nth layer includes memory plugs 702n and first and second conductive array lines (711n, 713n). Dielectric materials 825a, 825b, and 825n (e.g., $SiO_2$) may be used where necessary to provide electrical insulation between elements of the non-volatile memory device 820. Active circuits 840-852 can be configured to apply the select voltage potentials (e.g., read and write voltage potentials) to selected conductive array lines (e.g., 711a, b, ... n, and 713a, b, ... n). As was described above, the active circuits can be used to sense the read current $I_R$ from selected memory elements 120 during a read operation and can be configured to apply the un-select voltage potential to the un-selected array lines.

Figures 9, 10:
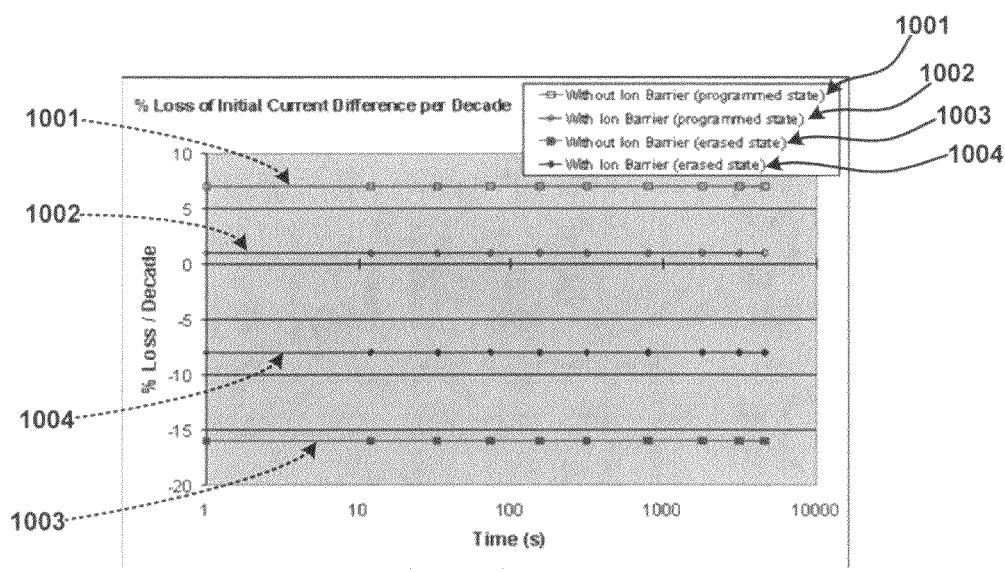
FIG. 9 is a table depicting data for erase and program slopes for memory elements with and without ion impeding layers.
FIG. 10 is a plot depicting current loss over time for memory elements with and without ion impeding layers.

Turning to FIG. 9, a table depicts data loss in memory elements with and without the ion impeding layer 103. In memory elements without the ion impeding layer 103, the structure comprises a layer of PCMO (e.g., a conductive oxide layer) and a layer of YSZ (e.g., an electrolytic tunnel barrier layer) sandwiched between a pair of Pt electrodes. For the 25 Å thick YSZ, the erase and program slopes are −15.6 and 9.3 respectively. For the 30 Å thick YSZ, the erase and program slopes are −17.3 and 4.3 respectively. In contrast, for the memory element including the ion impeding layer 103, the structure comprises a layer of PCMO (e.g., conductive oxide layer 101), a layer of $SiO_X$ (e.g., the ion impeding layer 103), and a layer of YSZ (e.g., the electrolytic tunnel barrier layer 105) sandwiched between a pair of Pt electrodes (e.g., 501, 503). For the 4 Å, 8 Å, and 20 Å thick $SiO_X$ layers, the values for the erase and program slopes are lower than those of the memory elements without the ion impeding layer 103 and those lower values are indicative of improved data retention.

In FIG. 10, the above erase and program slope values for the memory elements with and without the ion impeding layer 103 are averaged and plotted as percent of initial current loss per decade versus time. Plots for erase and program states of memory elements without the ion impeding layer 103 are denoted as 1001 and 1003 respectively. Plots for erase and program states of memory elements 120 with the ion impeding layer 103 are denoted as 1002 and 1004 respectively.

Figure 11:
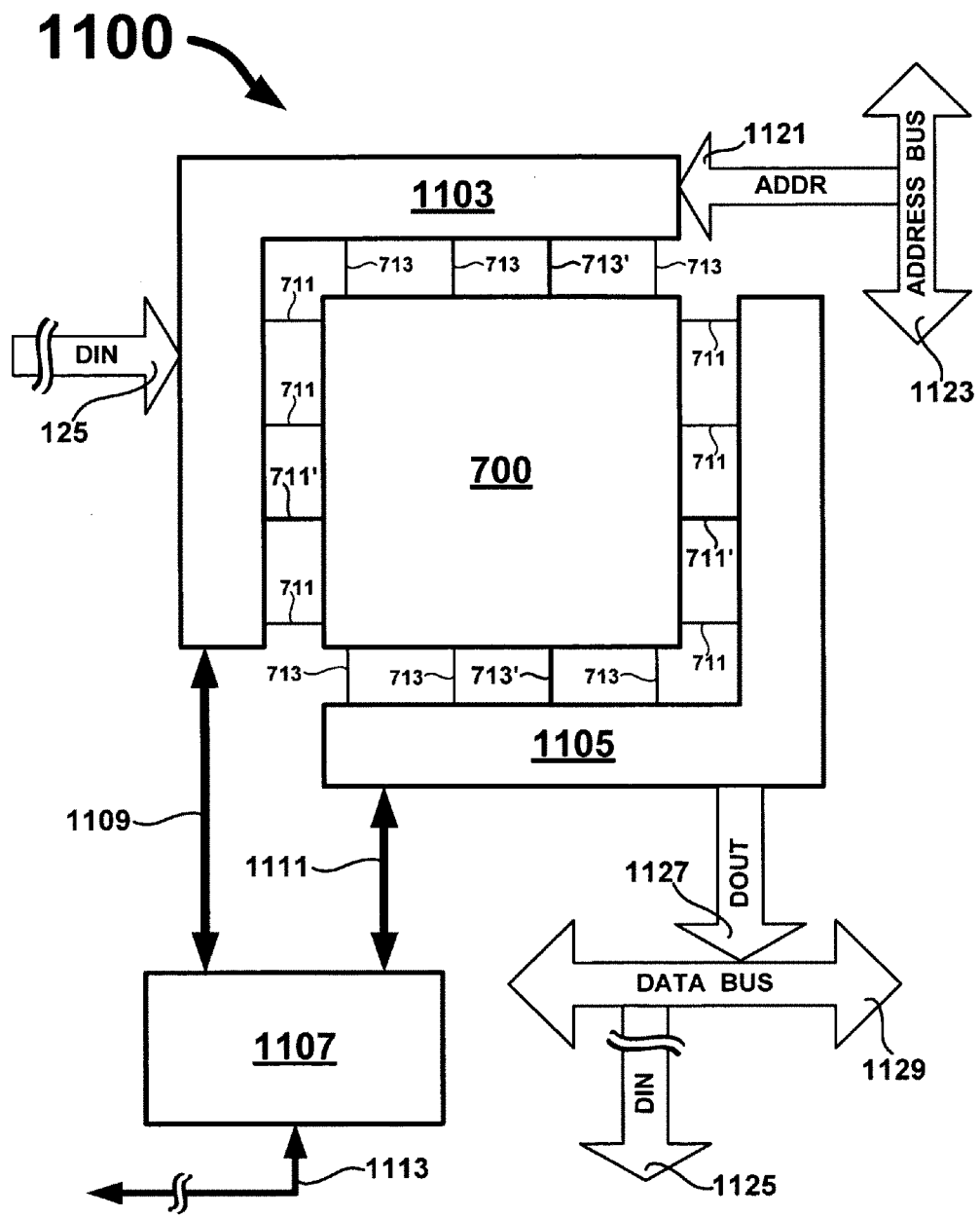
FIG. 11 depicts a memory system including a non-volatile two-terminal cross-point array.

Reference is now made to FIG. 11, where an exemplary memory system 1100 includes the aforementioned non-volatile two-terminal cross-point memory array 700 (array 700 hereinafter) and the plurality of first conductive and second conductive traces denoted as 711 and 713, respectively. The memory system 1100 also includes an address unit 1103 and a sense unit 1105. The address unit 1103 receives an address ADDR, decodes the address, and based on the address, selects at least one of the plurality of first conductive traces (denoted as 711') and one of the plurality of second conductive traces (denoted as 713'). The address unit 1103 applies select voltage potentials (e.g., read or write voltages) to the selected first and second conductive traces 711' and 713'. The address unit 1103 also applies a non-select voltage potential to unselected traces 711 and 712. The sense unit 1105 senses one or more currents flowing through one or more of the conductive traces. During a read operation to the array 700, current sensed by the sense unit 1105 is indicative of stored data in a memory plug (not shown) positioned at an intersection of the selected first and second conductive traces 711' and 713'. A bus 1121 coupled with an address bus 1123 can be used to communicate the address ADDR to the address unit 1103. The sense unit 1105 processes the one or more currents and at least one additional signal to generate a data signal DOUT that is indicative of the stored data in the memory plug. In some embodiments, the sense unit 1105 may sense current flowing through a plurality of memory plugs and processes those currents along with additional signals to generate a data signal DOUT for each of the plurality of memory plugs. A bus 1127 communicates the data signal DOUT to a data bus 1129. During a write operation to the array 700, the address unit 1103 receives write data DIN to be written to a memory plug specified by the address ADDR. A bus 1125 communicates the write data DIN from the data bus 1129 to the address unit 1103. The address unit 1103 determines a magnitude and polarity of the select voltage potentials to be applied to the selected first and second conductive traces 711' and 713' based on the value of the write data DIN. For example, one magnitude and polarity can be used to write a logic "0" and a second magnitude and polarity can be used to write a logic "1". In other embodiments, the memory system 1100 can include dedicated circuitry that is separate from the address unit 1103 to generate the select potentials and to determine the magnitude and polarity of the select potentials.

One skilled in the art will appreciate that the memory system 1100 and its components (e.g., 1103 and 1105) can be electrically coupled with and controlled by an external system or device (e.g., a microprocessor or a memory controller). Optionally, the memory system 1100 can include at least one control unit 1107 operative to coordinate and control operation of the address and sense units 1103 and 1105 and any other circuitry necessary for data operations (e.g., read and write operations) to the array 700. One or more signal lines 1109 and 1111 can electrically couple the control unit 1107 with the address and sense units 1103 and 1105. The control unit 1107 can be electrically coupled with an external system (e.g., a microprocessor or a memory controller) through one or more signal lines 1113.

As was described above in reference to FIGS. 8A and 8B, one or more of the arrays 700 can be positioned over a substrate that includes active circuitry and the active circuitry can be electrically coupled with the array(s) 700 using an interconnect structure that couples signals from the active circuitry with the conductive array lines 711 and 713. In FIG. 11, the busses, signal lines, control signals, the address, sense, and control units 1103, 1105, and 1107 can comprise the active circuitry and its related interconnect, and can be fabricated on a substrate (e.g., a silicon wafer) using a microelectronics fabrication technology, such as CMOS, for example.

Figure 12:
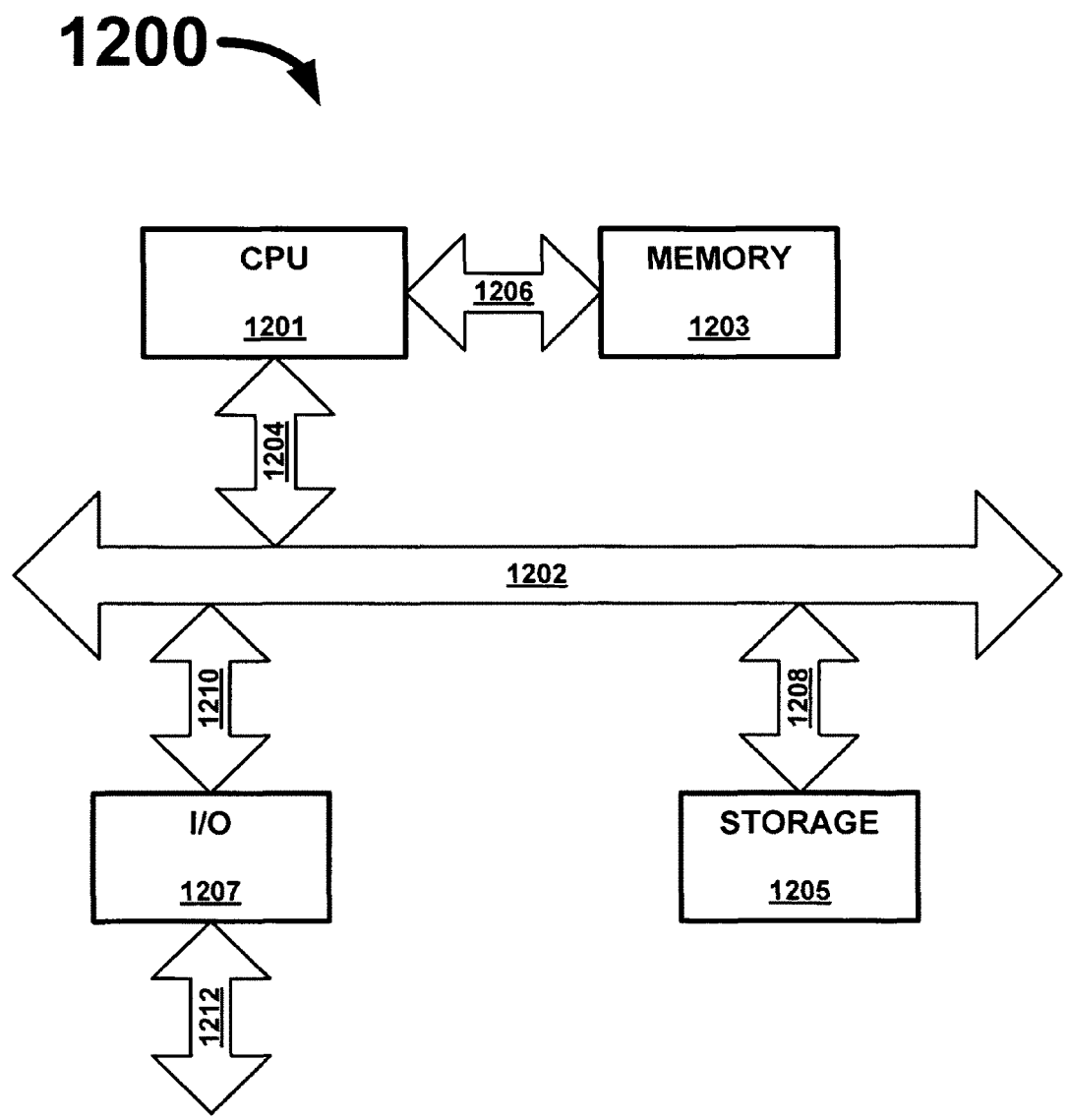
FIG. 12 depicts an exemplary electrical system that includes at least one non-volatile two-terminal cross-point array with a data retention structure for data storage.

Reference is now made to FIG. 12, where an electrical system 1200 includes a CPU 1201 that is electrically coupled 1204 with a bus 1202, an I/O unit 1207 that is electrically coupled 1210 with the bus 1202, and a storage unit 1205 that is electrically coupled 1208 with the bus 1202. The I/O unit 1207 is electrically coupled 1212 to external sources (not shown) of input data and output data. The CPU 1201 can be any type of processing unit including but not limited to a microprocessor (μP), a micro-controller (μC), and a digital signal processor (DSP), for example. Via the bus 1202, the CPU 1201, and optionally the I/O nit 1207, perform data operations (e.g., reading and writing data) on the storage unit 1205. The storage unit 1205 stores at least a portion of the data in the aforementioned non-volatile two-terminal cross-point array as depicted in FIGS. 7A through 8B. Each memory array includes a plurality of the two-terminal memory elements 120. The configuration of the storage unit 1205 will be application specific. Example configurations include but are not limited to one or more single layer non-volatile two-terminal cross-point arrays and one or more vertically stacked non-volatile two-terminal cross-point arrays. In the electrical system 1200, data stored in the storage unit 1205 is retained in the absence of electrical power. The CPU 1201 may include a memory controller (not shown) for controlling data operations to the storage unit 1205.

Alternatively, the electrical system 1200 may include the CPU 1201 and the I/O unit 1207 coupled with the bus 1202, and a memory unit 1203 that is directly coupled 1206 with the CPU 1201. The memory unit 1203 is configured to serve some or all of the memory needs of the CPU 1201. The CPU 1201, and optionally the I/O unit 1207, executes data operations (e.g., reading and writing data) to the non-volatile memory unit 1203. The memory unit 1203 stores at least a portion of the data in the aforementioned non-volatile two-terminal cross-point array as depicted in FIGS. 7A through 8B. Each memory array includes a plurality of the two-terminal memory elements 120. The configuration of the memory unit 1203 will be application specific. Example configurations include but are not limited to one or more single layer non-volatile two-terminal cross-point arrays and one or more vertically stacked non-volatile two-terminal cross-point arrays. In the electrical system 1200, data stored in the memory unit 1203 is retained in the absence of electrical power. Data and program instructions for use by the CPU 1201 may be stored in the memory unit 1203. The CPU 1201 may include a memory controller (not shown) for controlling data operations to the non-volatile memory unit 1205. The memory controller may be configured for direct memory access (DMA).

Although the invention has been described in its presently contemplated best mode, it is clear that it is susceptible to numerous modifications, modes of operation and embodiments, all within the ability and skill of those familiar with the art and without exercise of further inventive activity. Furthermore, although several embodiments of the present invention have been disclosed and illustrated herein, the invention is not limited to the specific forms or arrangements of parts so described and illustrated. The invention is only limited by the claims. Accordingly, that which is intended to be protected by Letters Patent is set forth in the claims and includes all variations and modifications that fall within the spirit and scope of the claim.

What is claimed is:

1. A non-volatile memory device, comprising:
   a memory element including
      a conductive oxide layer including mobile ions,
      an ion impeding layer in contact with the conductive oxide layer, and
      an electrolytic tunnel barrier layer in contact with the ion impeding layer,
   the memory element reversibly switchable from a first conductivity profile to a second conductivity profile upon application of a first write voltage across the memory element and reversibly switchable from the second conductivity profile to the first conductivity profile upon application of a second write voltage across the memory element,
   wherein an application of the first write voltage across the memory element generates a first electric field operative to move a quantity of the mobile ions in the conductive oxide layer through the ion impeding layer, whereby a conductivity of the memory element switches from the first conductivity profile to the second conductivity profile,
   wherein an application of the second write voltage across the memory element generates a second electric field operative to move substantially all of the quantity of mobile ions through the ion impeding layer and into the conductive oxide layer, whereby the conductivity of the memory element switches from the second conductivity profile to the first conductivity profile, and
   wherein the ion impeding layer is operative to substantially stop ion movement between the electrolytic tunnel barrier layer and the conductive oxide layer when a voltage having a magnitude that is less than the first write voltage or the second write voltage is applied across the memory element.

2. The non-volatile memory device as set forth in claim 1, wherein a conductivity profile of the memory element is non-destructively determined by applying a read voltage across the memory element.

3. The non-volatile memory device as set forth in claim 1, wherein the ion impeding layer is operative to substantially stop ion movement when a read voltage is applied across the memory element.

4. The non-volatile memory device as set forth in claim 1 and further comprising:
   a non-ohmic device sandwiched between a pair of electrodes, the non-ohmic device is electrically in series with the memory element and the pair of electrodes.

5. The non-volatile memory device as set forth in claim 1, wherein the conductive oxide layer comprises a conductive perovskite.

6. The non-volatile memory device as set forth in claim 5, wherein the conductive perovskite is a material selected from the group consisting of PCMO, LSCO, LNO, LCMO, PMO, LSMO, strontium titanate (STO), and a reduced STO.

7. The non-volatile memory device as set forth in claim 1, wherein the electrolytic tunnel barrier layer has a first conductivity and the ion impeding layer has a second conductivity that is higher than the first conductivity.

8. The non-volatile memory device as set forth in claim 1, wherein the electrolytic tunnel barrier layer has a first conductivity and the ion impeding layer has a second conductivity that is lower than the first conductivity.

9. The non-volatile memory device as set forth in claim 1, wherein the electrolytic tunnel barrier layer has a first thickness that is approximately 50 Å or less and the ion impeding layer has a second thickness that is approximately no greater than the first thickness.

10. The non-volatile memory device as set forth in claim 1, wherein the mobile ions comprises oxygen ions.

11. The non-volatile memory device as set forth in claim 1, wherein the ion impeding layer is made from a material selected from the group consisting of $LaAlO_3$, $TiO_X$, $TaO_X$, $AlO_X$, $SiO_X$, $IrO_X$, MgO, Pt, strontium ruthenate (SRO), and a reduced SRO.

12. The non-volatile memory device as set forth in claim 1, wherein the electrolytic tunnel barrier layer is made from an electronically insulating material.

13. The non-volatile memory device as set forth in claim 12, wherein the electronically insulating material is a material selected from the group consisting of yttria-stabilized zirconia (YSZ), $ZrO_2$, $HfO_2$, and $Er_2O_3$.

14. The non-volatile memory device as set forth in claim 1, wherein a conductivity profile of the memory element is indicative of stored data and the memory element is operative to retain the stored data in the absence of power.

* * * * *